(12) United States Patent
Chang et al.

(10) Patent No.: US 12,490,503 B2
(45) Date of Patent: Dec. 2, 2025

(54) VOLTAGE REGULATOR HAVING VARIABLE OUTPUT CAPACITANCE AND METHODS FOR FORMING THE SAME

(71) Applicant: Taiwan Semiconductor Manufacturing Company Limited, Hsinchu (TW)

(72) Inventors: Kuo-Pin Chang, Zhubei (TW); Chien Hung Liu, Hsinchu (TW); Yu-Wei Ting, Taipei (TW); Kuo-Ching Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 395 days.

(21) Appl. No.: 18/317,986

(22) Filed: May 16, 2023

(65) Prior Publication Data
US 2024/0387516 A1     Nov. 21, 2024

(51) Int. Cl.
*H10D 84/80*     (2025.01)
*H01L 23/34*     (2006.01)
*H01L 23/373*    (2006.01)
*H01L 23/522*    (2006.01)
*H02M 1/00*      (2006.01)
(Continued)

(52) U.S. Cl.
CPC ......... *H10D 84/811* (2025.01); *H01L 23/345* (2013.01); *H01L 23/373* (2013.01); *H01L 23/5226* (2013.01); *H02M 1/0012* (2021.05); *H02M 1/0025* (2021.05); *H02M 3/157* (2013.01); *H10D 84/83* (2025.01)

(58) Field of Classification Search
CPC ... H10D 84/811; H10D 84/83; H02M 1/0025; H02M 1/0012; H02M 3/157; H01L 23/345; H01L 23/373; H01L 23/5226

USPC .......................................................... 257/379
See application file for complete search history.

(56) References Cited

U.S. PATENT DOCUMENTS 11,955,488 B2 *   4/2024   Udrea .................. H10D 62/343
2012/0104862 A1   5/2012   Ito et al.

FOREIGN PATENT DOCUMENTS

| TW | 202228266 A | 7/2022 |
| TW | 202311903 A | 3/2023 |
| TW | 202314986 A | 4/2023 |

OTHER PUBLICATIONS

Jianq Chyun Intellectual Property Office; TW Application No. 112125730; Office Action mailed Feb. 26, 2024; 10 pages.

* cited by examiner

*Primary Examiner* — Tu-Tu V Ho
(74) *Attorney, Agent, or Firm* — The Marbury Law Group, PLLC

(57) ABSTRACT

A device structure includes a voltage regulator circuit, which includes: a first semiconductor die including a pulse width modulation (PWM) circuit and connected to a PWM voltage output node at which a pulsed voltage output is generated; and a series connection of an inductor and a parallel connection circuit, the parallel connection circuit including a parallel connection of capacitor-switch assemblies. A first end node of the series connection is connected to the PWM voltage output node; a second end node of the series connection is connected to electrical ground; each of the capacitor-switch assemblies includes a respective series connection of a respective capacitor and a respective switch; and each switch within the capacitor-switch assemblies is located within the first semiconductor die.

20 Claims, 19 Drawing Sheets

(51) Int. Cl.
*H02M 3/157* (2006.01)
*H10D 84/83* (2025.01)

VOLTAGE REGULATOR HAVING VARIABLE OUTPUT CAPACITANCE AND METHODS FOR FORMING THE SAME

BACKGROUND

A voltage regulator is a semiconductor circuit that generates a constant output voltage. In some instances the voltage regulator may output a voltage that is lower than a power supply voltage using a switching circuit and a voltage stabilization circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
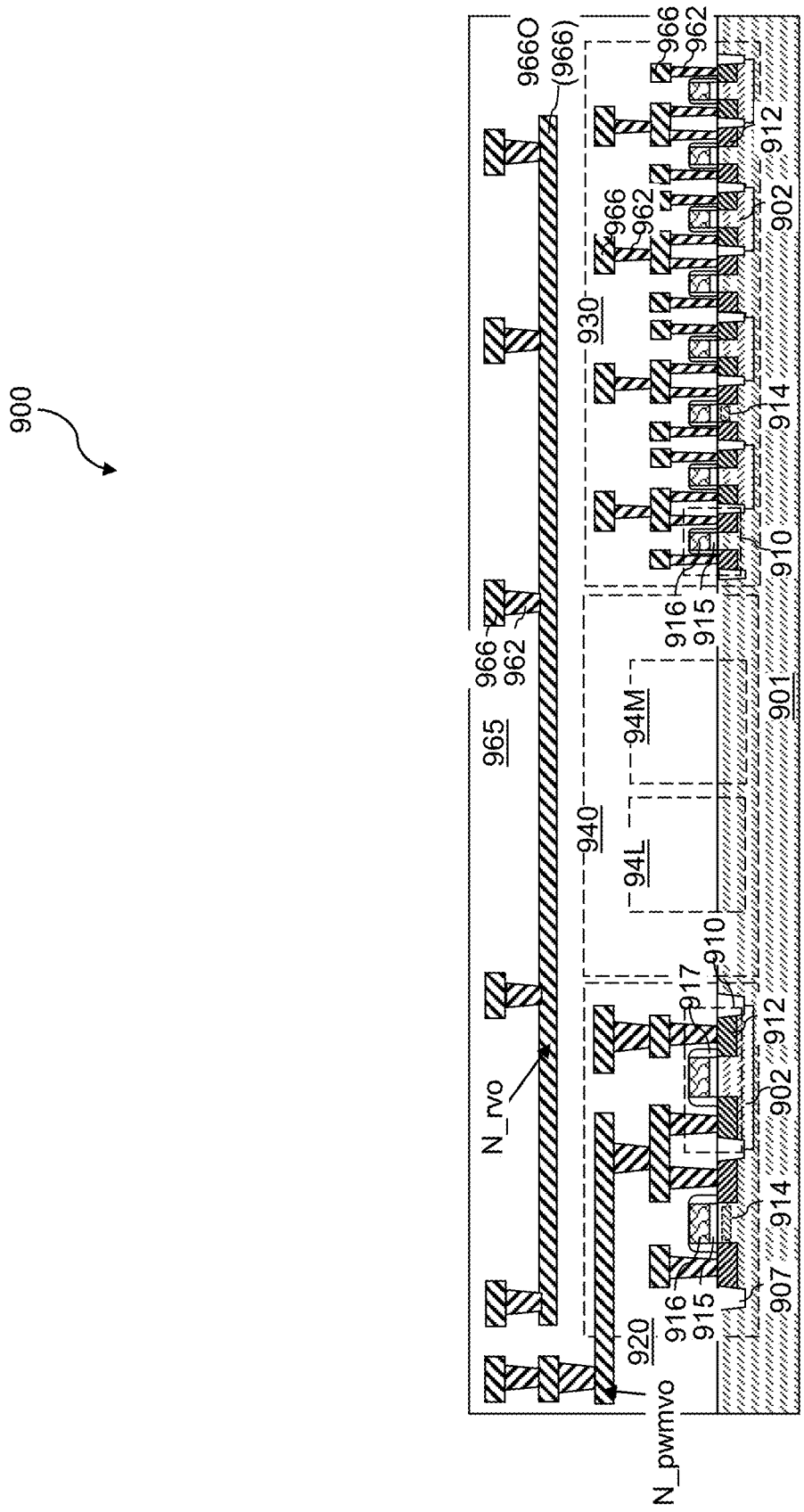
FIG. 1 is a vertical cross-sectional view of a first semiconductor die after formation of first semiconductor devices, first metal interconnect structures, and first dielectric material layers according to the first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Various embodiments of the present disclosure are directed to a power supply circuit such as a voltage regulator circuit comprising a bonded assembly of two semiconductor dies. According to an aspect of the present disclosure, the voltage regulator circuit of the present disclosure may have a variable output capacitance which may be varied and programmed as need based on external output or a programming parameter that may be provided during operation of the voltage regulator circuit.

A voltage regulator circuit may be used to generate a noiseless regulated direct current (DC) power supply voltage (which may be referred to as a core voltage and may be provided to logic devices in a logic core of a semiconductor die) from a noisy unregulated DC power supply voltage provided from a printed circuit board (PCB). A voltage regulator circuit uses an inductor, a capacitor, and switches to regulate the noisy input voltage into a noiseless output voltage. The magnitude of the output voltage is generally controlled by the duty cycle D of the PCM circuit. The duty cycle refers to the fraction of time duration during which the voltage applied to the input node of the PCM circuit is transmitted to the output node per each cycle (i.e., an on operation and an off operation) of the PCM circuit. A series connection of an inductor and at least one capacitor may be connected to the output node of the PCM circuit, and the output voltage of the voltage regulator circuit may be provided at the node between the inductor and the at least one capacitor. The ripple current ($\Delta I_o$) of the voltage regulator circuit is given by:

$$V_o/V_i=D, \Delta I_o=(V_i-V_o)D/L*f_{sw},$$

A smaller capacitance of the at least one capacitor reduces power consumption, while a larger capacitance of the at least one capacitor reduces the voltage ripple in the output node. A large capacitance also delays a switching time from a light load operation mode to a heavy load operation mode.

Various embodiment voltage regulator circuits of the present disclosure may comprise multiple capacitors that may be individually connected and/or disconnected via switches to a regulated voltage output node. Thus, the output capacitance of the voltage regulator circuit may be optimized during operation of the circuit to provide an optimal capacitance level depending on the magnitude of the output voltage and depending on the power load on the voltage regulator circuit.

Generally, an optimal output capacitance of a voltage regulator circuit may minimize the ripple current at a target output voltage. In various embodiment voltage regulator circuits of the present disclosure, the ability to provide a variable output capacitance to the voltage regulator circuit may be provided through a set of switches provided in a first semiconductor die that also contains a pulse width modulation (PWM) circuit. The variable output capacitance of the embodiment voltage regulator circuits may provide a wide range for a programmable regulated output voltage while minimizing the ripple current and reducing power consumption at the same time through selection of an optimal output capacitance for each selected value of the regulated output voltage.

In the various embodiment voltage regulator circuits, the switches may comprise phase change material (PCM) switches or may comprise field effect transistor switches. In embodiments in which the PCM switches are used, the PCM switches may transition between an on state and an off state by passing a suitable programming current to a heater element connected to respective phase change material portion within the PCM switches.

According to an aspect of the present disclosure, the pulse width modulation circuit and the switches may be formed in a first semiconductor die, and the capacitors and the inductor may be formed in a second semiconductor die. An array of first semiconductor dies may be provided in a first wafer, and an array of second semiconductor dies may be provided in a second wafer, and the two wafers may be bonded to each other by wafer-to-wafer bonding, which may use metal-to-metal and optionally dielectric-to-dielectric bonding. The various embodiments of the present disclosure are now described with reference to accompanying drawings.

FIG. 1 is a vertical cross-sectional view of a first semiconductor die 900 after formation of first semiconductor devices, first metal interconnect structures (962, 966), and first dielectric material layers 965 according to the first embodiment of the present disclosure. The first semiconductor die 900 may be one of a plurality of semiconductor dies within a two-dimensional periodic array of semiconductor dies formed on a first semiconductor wafer, such as a commercially available single crystalline silicon wafer. The first semiconductor wafer may comprise a first semiconductor substrate 901, which may be a single crystalline silicon wafer. It is understood that only a portion of the first semiconductor die 900 is illustrated, and that the first semiconductor die 900 may comprise many other semiconductor circuits, which may include logic circuits and/or memory circuits. As such, the portion of the first semiconductor die 900 may be incorporated into a larger semiconductor die including additional semiconductor devices such as, but not limited to, complementary metal-oxide-semiconductor (CMOS) devices.

The illustrated portion of the first semiconductor die 900 comprises device components 902 that may be used to provide a voltage regulator circuit according to embodiments of the present disclosure. The device components may comprise field effect transistors 910, each of which comprises a respective pair of source/drain regions 912, a respective semiconductor channel 914, a respective gate dielectric 915, a respective gate electrode 916, and optionally a respective dielectric gate spacer 917. Isolation trenches 907 may also separate and isolate device components 902.

According to an aspect of the present disclosure, the first semiconductor die 900 may comprise a pulse width modulation (PWM) circuit 920. The PWM circuit 920 may comprise a first set of field effect transistors 910 located on the first semiconductor substrate 901. The PWM circuit 920 may comprise a series connection of two field effect transistors 910 having complimentarily connected gates, i.e., one gate turns on a respective field effect transistor while the other gate turn on the other field effect transistor. The operational principle for a PWM circuit 920 is well known in the art. In essence, the output node of the PWM circuit 920 is the middle node in which two source/drain regions of the two field effect transistors are electrically connected, and the output voltage is a square wave of a selected duty cycle D, which is programmable depending on the parameter provided to the control circuit that controls the voltage pattern applied to the two gate electrodes of the PWM circuit 920.

According to an embodiment of the present disclosure, the first semiconductor die 900 may comprise a programing pulse generator circuit 930 including a second subset of the field effect transistors 910. The programing pulse generator circuit 930 may comprise PCM programming transistors (which are a subset of the second subset of the field effect transistors 910), which are configured to control flow of electrical current through a respective one of heater lines in the PCM switches to be subsequently formed. In other words, some of the field effect transistors 910 within the programming pulse generator circuit 930 are PCM programming transistors.

The programming pulse generator circuit 930 may comprise a plurality of output nodes that are configured to provide two types of programming pulses for phase change memory (PCM) switches to be subsequently formed. The two types of programming pulses may comprise an amorphization programming pulse (an off-state-inducing pulse) that provides a pulse of a short duration and abrupt pulse ending pattern, such as a duration of less than 1 microsecond, that may cause amorphization of a respective phase change material portion in a respective PCM switch. The two types of programming pulses may comprise a crystallization programming pulse (an on-state-inducing pulse) that provides a pulse of a longer duration and optionally, a gradual pulse ending pattern, such as a duration of more than 1 microsecond and stepped pulse ending, that may cause amorphization of a respective phase change material portion in a respective PCM switch.

Further, the semiconductor die 900 may comprise a switch control circuit 940 that is configured to provide circuit operation instructions for actuating the various PCM switches to be subsequently formed. For example, the switch control circuit 940 may provide circuit operation instructions to the programing pulse generator circuit 930 such that the second subset of the field effect transistors 910 provides a selected programming pulse to each of the PCM switches to be subsequently formed. The switch control circuit 940 may comprise a control logic circuit 94L and a memory array 94M.

The duty cycle for the pulse width modulation (PWM) circuit 920 may be determined from the target output voltage, which may be predetermined, or may be changed during operation of the voltage regulator circuit, for example, by instructions from a processor core or from a program. A look-up table in the semiconductor die may include information for connection and disconnection of each capacitor for each value of the target output voltage. The look-up table may comprise a pre-programmed array of memory elements (such as a static random access memory cells or a one-time programmable (OTP) memory elements). A switch control circuit 940 may provide suitable control voltages and/or other circuit operation instructions for actuating the various switches 980 (see FIG. 2).

In one embodiment, the switch control circuit 940 may be located on the first semiconductor substrate 901, and may be configured to control turn-on and turn-off of each of the switches 980 (see FIG. 2) within the capacitor-switch assemblies (750 (see FIG. 10), 980) by applying gate voltages to the field effect transistors 910 within the second set of field effect transistors 910 within the programing pulse generator circuit 930. In one embodiment, the switch control circuit 940 may be configured to receive a value for a target direct current (DC) output voltage for the voltage regulator circuit, and the switch control circuit 940 comprises a memory array 94M containing a look-up table for values of the gate voltages for each value of the target DC output voltage. The switch control circuit 940 may be configured to generate the gate voltages for the field effect transistors 910 within the second set of field effect transistors 910 using the look-up table and the received value for the target DC output voltage.

First metal interconnect structures (962, 966) and first dielectric material layers 965 may be formed above the various semiconductor devices formed on the first semiconductor substrate 901. The first metal interconnect structures (962, 966) may comprise first metal via structures 962 and first metal line structures 966. The first dielectric material layers 965 comprise interconnect-level dielectric (ILD) materials as known in the art, which comprise, for example, undoped silicate glass, doped silicate glasses, silicon nitride, porous or non-porous organosilicate glass, silicon oxynitride, silicon carbide nitride, dielectric metal oxides, etc. The first metal interconnect structures (962, 966) may be wired to provide necessary functionality to each circuit.

According to an aspect of the present disclosure, the electrically conductive paths provided by the first metal interconnect structures (962, 966) comprise connections for the power input node of the PWM circuit 920, which is connected to the power input from a printed circuit board (not shown) upon electrical connection of the first semiconductor die to the printed circuit board. An output node of the PWM circuit 920 comprises a PWM voltage output node N_pwmvo at which a pulsed voltage output is generated. Thus, the output node of the first set of field effect transistors 910 is connected to, and may be the same as, the PWM voltage output node N_pwmvo. Further, a subset of the first metal line structures 966 constitutes an output bus metal line structure 9660, which is the node of the regulated voltage output, i.e., the regulated voltage output node N_rvo.

Figure 2:
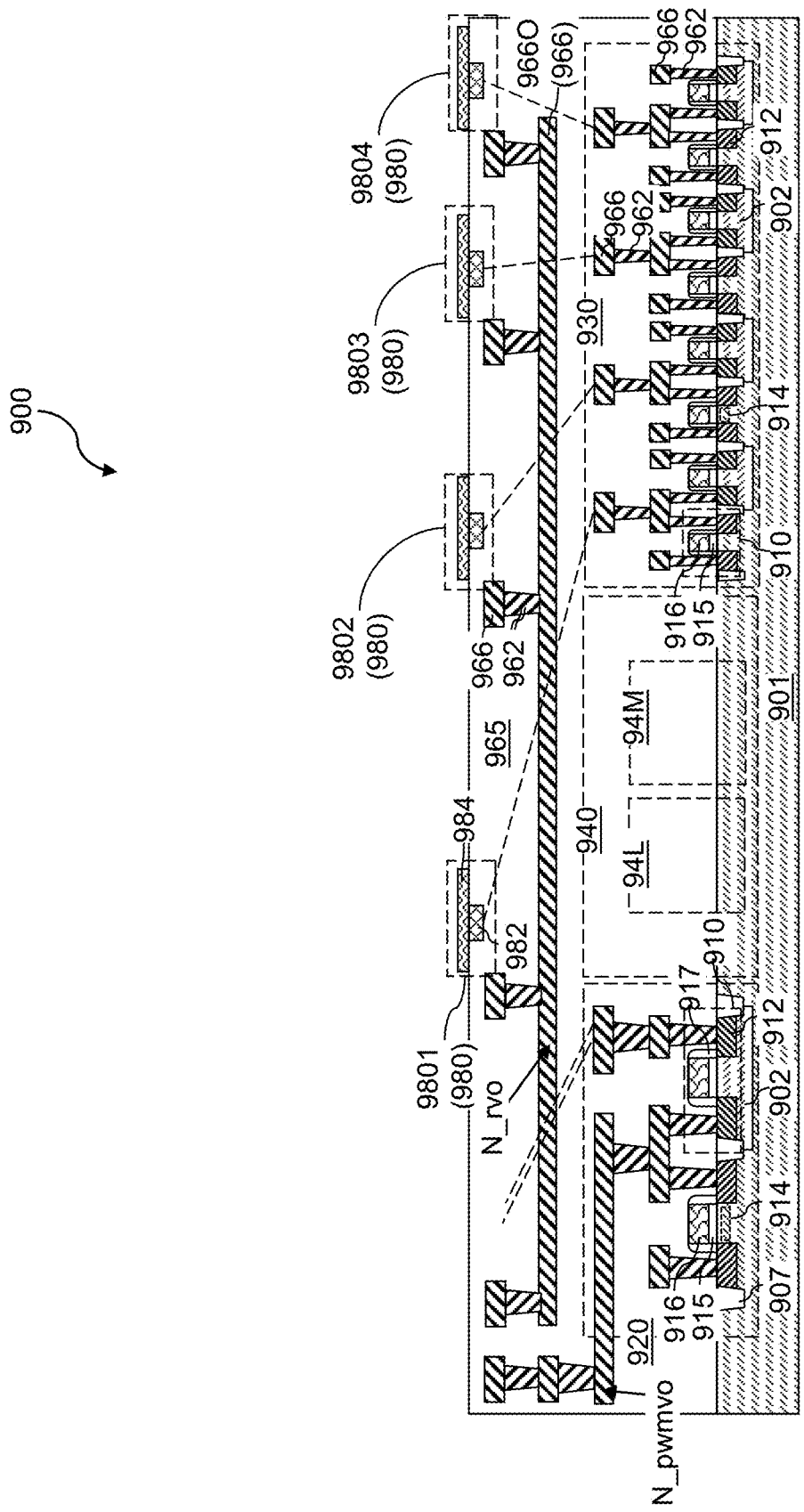
FIG. 2 is a vertical cross-sectional view of the first semiconductor die after formation of phase change material (PCM) switches according to the first embodiment of the present disclosure.
Figure 3:
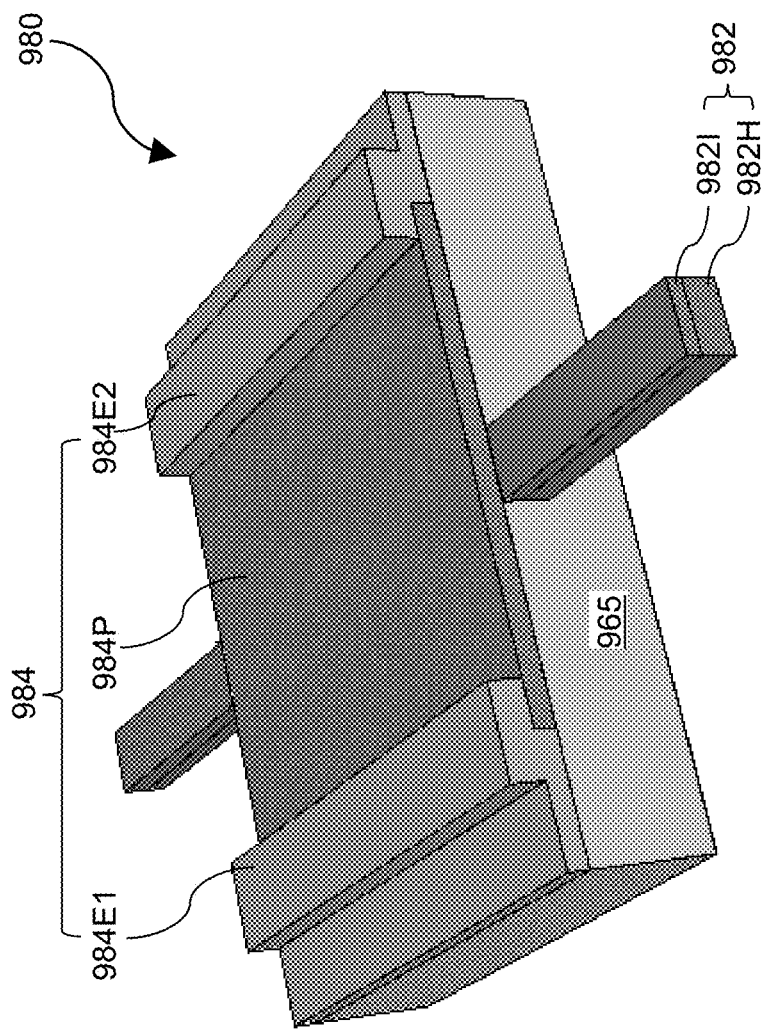
FIG. 3 is a perspective view of a PCM switch that may be used in the first structure.

Referring to FIGS. 2 and 3, phase change material (PCM) switches (9801, 9802, 9803, 9804) may be formed at a metal interconnect level in the first semiconductor die 900. FIG. 2 illustrates a portion of the first semiconductor die 900, and FIG. 3 illustrates a perspective view of a PCM switch 980, which may be any of the PCM switches (9801, 9802, 9803, 9804) illustrated in FIG. 2. The multiple switches 980 may be configured to connect or disconnect a respective capacitor (to be provided at a later processing step) of the voltage regulator circuit to the output node of the voltage regulator circuit, i.e., the regulated voltage output node N_rvo. In the illustrative example, the PCM switches 980 (9801, 9802, 9803, 9804, collectively 980) comprise a first PCM switch 9801, a second PCM switch 9802, a third PCM switch 9803, and a fourth PCM switch 9804.

Each of the PCM switches 980 comprises a respective variable resistance element 984 and a respective heater element 982. The variable resistance element 984 comprises a phase change memory (PCM) material portion 984P, a first PCM contact electrode 984E1 contacting a first end portion of the PCM material portion 984P, and a second PCM contact electrode 984E2 contacting a second end portion of the PCM material portion 984P. The heater element 982 may underlie, or overlie, a middle portion of the PCM material portion 984, and is configured to heat the PCM material portion 984P. The heater element 982 may comprise a stack of a thermally-conductive and electrically-insulating liner 982I and a heater line 982H. The thermally-conductive and electrically-insulating liner 982I may contact a middle portion of the PCM material portion 984. In one embodiment, the heater element 984 may be embedded within one of the first dielectric material layers 965.

The PCM material portions 984 comprise a phase change memory material. As used herein, a "phase change memory material" refers to a material having at least two different phases providing different resistivity. A phase change memory (PCM) material may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). phase change memory materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds.

The first PCM contact electrode 984E1 and the second PCM contact electrode 984E2 comprise a metallic material such as a conductive metallic nitride (such as TiN, TaN, WN, MON, etc.), a conductive metallic carbide (such as TiC, TaC, WC, etc.), an elemental metal (such as Ti, Ta, W, Mo, Co, Ru, Cu, etc.), an intermetallic alloy, or a combination or a layer stack thereof. The thermally-conductive and electrically-insulating liner 982I may comprise, for example, aluminum nitride. The heater line 982H comprises a suitable metallic material such as TiN, TaN, WN, Ti, Ta, W, Mo, etc.

Figure 4:
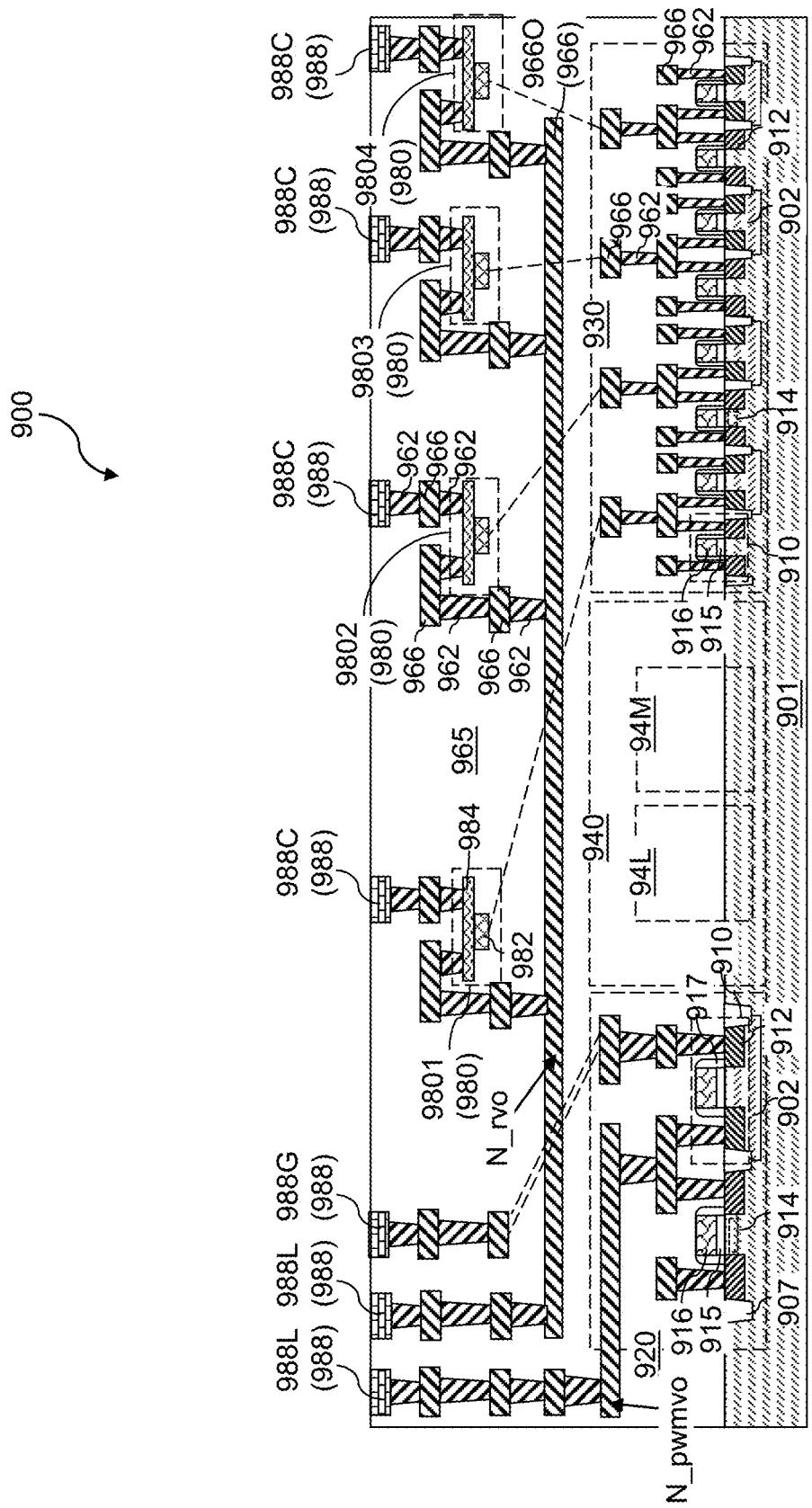
FIG. 4 is a vertical cross-sectional view of the first structure after formation of additional first metal interconnect structures, first bonding pads, and additional first dielectric material layers according to the first embodiment of the present disclosure.

Referring to FIG. 4, additional first metal interconnect structures (962, 966), first bonding pads 988, and additional first dielectric material layers 965 may be formed over the PCM switches 980. First bonding pads 988 may be formed in the topmost one of the first dielectric material layers 965, which is herein referred to as a first bonding-level dielectric layer (not separately shown). The first bonding pads 988 may comprise a pair of inductor-connection bonding pads 988L, at least one electrical-ground bonding pad 988G, and a plurality of capacitor-connection bonding pads 988C.

Two end portions of the heater line 982H may contact a respective one of the first metal interconnect structures (962, 966), which may be a pair of first metal via structures 962 or a pair of first metal line structures 966. Each of the first PCM contact electrode 984E1 and the second PCM contact electrode 984E2 may contact a respective one of the first metal interconnect structures (962, 966), which may be a pair of first metal via structures 962 or a pair of first metal line structures 966.

For each PCM switch 980, one end of each heater line may be connected to electrical ground, and another end of each heater line may be connected to an output node of a respective PCM programming transistor in the programming pulse generator circuit 930. The electrical connections (which may comprise a subset of the first metal interconnected structures (962, 966) that is not illustrated) between heater lines and the PCM programming transistors) are schematically illustrated by dotted lines in FIG. 4. For each PCM switch 980, a contact electrode (such as a first PCM contact electrode 984E1 illustrated in FIG. 3) may be electrically connected to the output bus metal line structure 966O (which is the node of the regulated voltage output, i.e., the regulated voltage output node N_rvo), and another contact electrode (such as a second PCM contact electrode 984E2 illustrated in FIG. 3) may be electrically connected to a respective one of the capacitor-connection bonding pads 988C. One of the inductor-connection bonding pads 988L may be electrically connected to a first metal interconnect structure (962, 966) embodying the PWM voltage output node N_pwmvo. Another of the inductor-connection bonding pads 988L is electrically connected to the output bus metal line structure 966O. The at least one electrical-ground bonding pad 988G may be electrically connected to other electrical ground nodes (of which one connection is schematically illustrated by a double-dotted line).

Generally, a first semiconductor die 900 is provided, which comprises a first semiconductor substrate 901, a pulse width modulation (PWM) circuit 920 including a first set of field effect transistors 910 located on the first semiconductor substrate 901, and first metal interconnect structures (962, 966) and first bonding pads 988 located in first dielectric material layers 965. The PWM circuit 920 comprises a PWM voltage output node N_pwmvo at which a pulsed voltage output is generated. PCM switches 980 may be formed within the first dielectric material layers 965.

Figure 5:
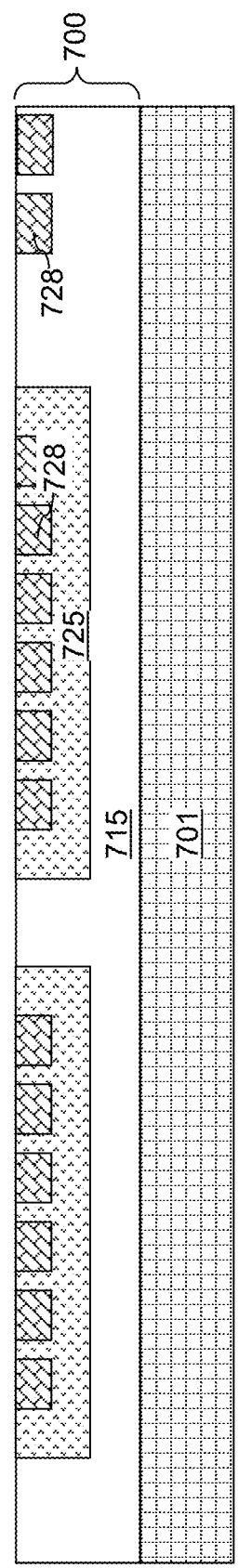
FIG. 5 is a vertical cross-sectional view of a second semiconductor die after formation of an inductor and dielectric material layers over a carrier substrate according to the first embodiment of the present disclosure.

Referring to FIG. 5, a second semiconductor die 700 according to the first embodiment of the present disclosure may be formed on a carrier wafer 701. The second semiconductor die 700 may be one of semiconductor dies within a two-dimensional periodic array of semiconductor dies that is formed on the carrier wafer 701. The carrier wafer 701 may be a semiconductor wafer, an insulating material wafer, or a conductive material layer, and may, or may not, have the same size as the first semiconductor wafer including the first semiconductor substrate 901. It is understood that only a portion of the second semiconductor die 700 is illustrated, and that the second semiconductor die 700 may comprise additional instances of passive devices than the passive devices that are subsequently illustrated in the drawings of the instant application.

A dielectric matrix layer, which is herein referred to as an inductor-level dielectric matrix layer 715, may be formed on a top surface of the carrier wafer 701. The inductor-level dielectric matrix layer 715 may comprise undoped silicate glass, a doped silicate glass, silicon nitride, or any other dielectric material that may be formed with a planar surface over the carrier wafer 701. The thickness of the inductor-level dielectric matrix layer 715 may be in a range from 300 nm to 3,000 nm, although lesser and greater thicknesses may also be used.

Optionally, at least one recess region may be formed in an upper portion of the inductor-level dielectric matrix layer 715, and may be filled with a high-permeability material (such as iron), which may have a relative permeability in a range from 1,000 to 1,000,000, such as from 2,000 to 10,000. Excess portions of the high-permeability material may be removed from above the horizontal plane including the top surface of the inductor-level dielectric matrix layer 715, for example, by chemical mechanical polishing (CMP). A remaining portion of the high-permeability material constitutes an inductor core structure 725. In one embodiment, the inductor core structure 725 may have a shape of an annular plate.

A groove having an inductor wiring pattern may be formed in an upper portion of the inductor core structure 725 such that end portions of the groove is formed within an upper portion of the inductor-level dielectric matrix layer 715. A dielectric liner (not illustrated) may be deposited to provide electrical isolation of a conductive material to be subsequently deposited in the groove from the material of the inductor core structure 725. At least one conductive material, such as a metallic barrier liner material (e.g., TiN, TaN, WN, or MoN) and a high-conductivity metallic fill material (e.g., Cu, Ag, or Al) may be deposited in the groove, and excess portions of the at least one conductive material may be removed from above the horizontal plane including the top surface of the inductor-level dielectric material layer 715. The remaining portion of the at least one conductive material filling the groove constitutes an inductor 728.

While the present disclosure is described using a configuration for an inductor 728, any other types of inductors known in the art may be constructed over the carrier wafer 701. The invention of the present disclosure is not limited by any particular type of inductor structure provided that an inductor 728 may be formed over a carrier wafer 701.

Figure 6:
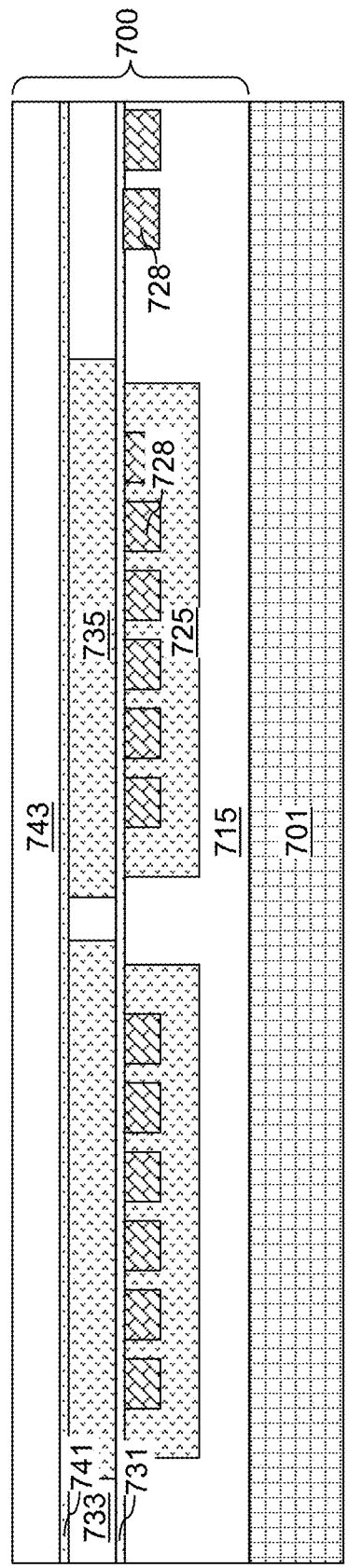
FIG. 6 is a vertical cross-sectional view of the second semiconductor die after formation of an inductor and additional dielectric material layers according to the first embodiment of the present disclosure.

Referring to FIG. 6, a first dielectric capping layer 731 may be deposited over the inductor 728, and an optional high-permeability capping structure 735 including a high permeability material (such as iron) may be formed over the inductor 728. A capping dielectric matrix layer 733 including a dielectric material may be formed around the high-permeability capping structure 735, and a second dielectric capping layer 741 may be deposited over the high-permeability capping structure 735 and the capping dielectric matrix layer 733. A planar spacer dielectric layer 743 may be formed over the second dielectric capping layer 741. The planar spacer dielectric layer 743 comprises a dielectric material such as silicon oxide or silicon nitride, and may have a thickness in a range from 100 nm to 3,000 nm, although lesser and greater thicknesses may also be used.

Figure 7:
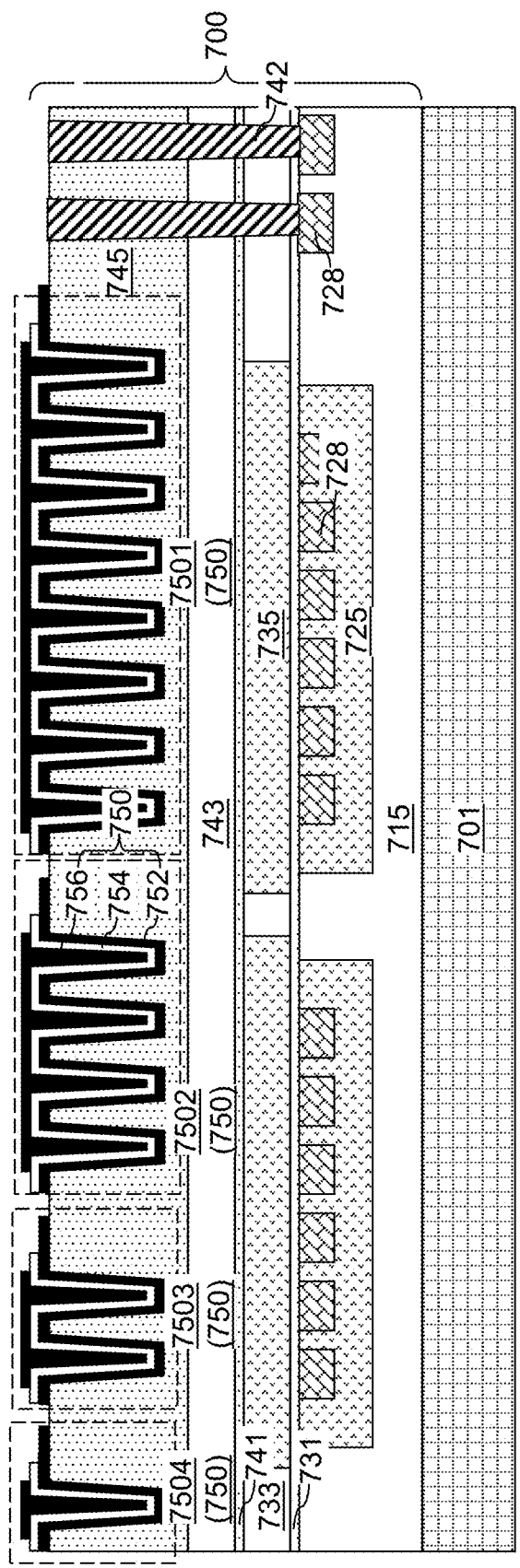
FIG. 7 is a vertical cross-sectional view of the second semiconductor die after formation of capacitors according to the first embodiment of the present disclosure.

Referring to FIG. 7, a capacitor matrix layer 745 may be formed over the planar spacer dielectric layer 743. The capacitor matrix layer 745 may comprise an insulating material, a semiconductor material, or a conductive material depending on the design of capacitors to be subsequently formed. The thickness of the capacitor matrix layer 745 may be in a range from 500 nm to 10,000 nm, although lesser and greater thicknesses may also be used.

Inductor-connection via structures 742 may be formed through the capacitor matrix layer 745, for example, by forming via cavities and filling the via cavities with at least one conductive material. The inductor-connection via structures 742 may contact a respective end of the inductor 728. In embodiments in which the capacitor matrix layer 745 comprises a semiconductor material or a conductive material, an insulating liner (not shown) may be formed at a periphery of each of the via cavities prior to formation of the inductor-connection via structures 742.

A plurality of capacitors 750 may be formed in, or on, the capacitor matrix layer 745. In an illustrative example, deep trenches having a depth not exceeding the thickness of the capacitor matrix layer 745 may be formed in the capacitor matrix layer 745, and at least two electrode material layers interlaced with at least one node dielectric layer may be deposited by a respective conformal deposition process in the deep trenches. The at least two electrode material layers and the at least one node dielectric layer may be subsequently patterned to form multiple contiguous sets of at least two electrodes and at least one node dielectric. Each contiguous set of at least two electrodes and at least one node dielectric constitutes a capacitor 750. In the illustrative example, each capacitor 750 comprises a first electrode 752, a node dielectric 754, and a second electrode 756.

The capacitors 750 may be formed with the same value of capacitance or with different values for the capacitance. In one embodiment, the capacitors 750 may be formed with values of the capacitance that are products of a unit value of capacitance and non-negative integer powers of 2, such as 1, 2, 4, 8, 16, 32, 64, etc. In the illustrative example, the capacitors 750 comprises a first capacitor 7501 having 8 times the capacitance of a fourth capacitor 7504, a second capacitor 7502 having 4 times the capacitance of the fourth capacitor 7504, a third capacitor 7503 having 2 times the capacitance of the fourth capacitor 7504, and the fourth capacitor 7504.

While the present disclosure is described using deep trench capacitors each including two electrodes (752, 756) and a node dielectric 754, embodiments are expressly contemplated herein in which other types of capacitors are used. The invention of the present disclosure is not limited by any particular type of capacitors provided that a plurality of capacitors may be formed over the carrier wafer 701.

Figure 8:
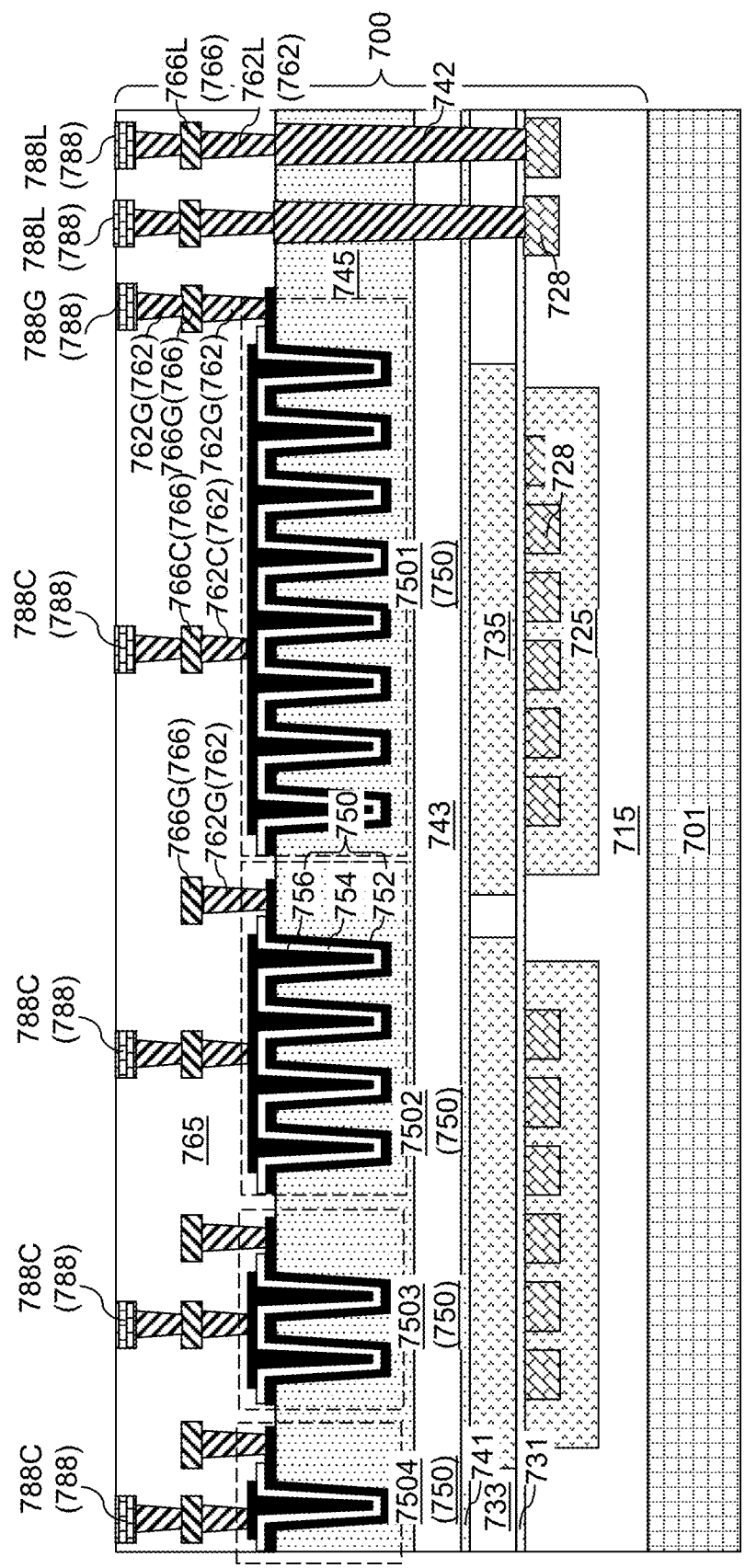
FIG. 8 is a vertical cross-sectional view of the second semiconductor die after formation of second metal interconnect structures and second dielectric material layers according to the first embodiment of the present disclosure.

Referring to FIG. 8, second metal interconnect structures (762, 766) and second dielectric material layers 765 may be formed above the capacitors 750. The second metal interconnect structures (762, 766) may comprise second metal via structures 762 and second metal line structures 766. The second metal via structures 762 may comprise inductor-connection metal via structures 762L, capacitor-connection metal via structures 762C, and electrical-ground metal via structures 762G. The second metal line structures 766 may comprise inductor-connection metal line structures 766L, capacitor-connection metal line structures 766C, and electrical-ground metal line structures 766G. The second dielectric material layers 765 comprise interconnect-level dielectric (ILD) materials as known in the art, which comprise, for example, undoped silicate glass, doped silicate glasses, silicon nitride, porous or non-porous organosilicate glass, silicon oxynitride, silicon carbide nitride, dielectric metal oxides, etc. The second metal interconnect structures (762, 766) may be wired to provide electrical connections to the inductor 728 and the capacitors 750.

Second bonding pads 788 may be formed in the topmost one of the second dielectric material layers 765, which is herein referred to as a second bonding-level dielectric layer (not separately shown). The second bonding pads 788 may comprise a pair of inductor-connection bonding pads 788L, at least one electrical-ground bonding pad 788G, and a plurality of capacitor-connection bonding pads 788C. The pattern of the second bonding pads 788 may be a mirror image pattern of the pattern of the first bonding pads 988.

Generally, a second semiconductor die 700 is provided, which comprises capacitors 750, and second metal interconnect structures (762, 766) and second bonding pads 788 located in second dielectric material layers 765. The second semiconductor die 700 may additionally comprise an inductor 728.

Figure 9:
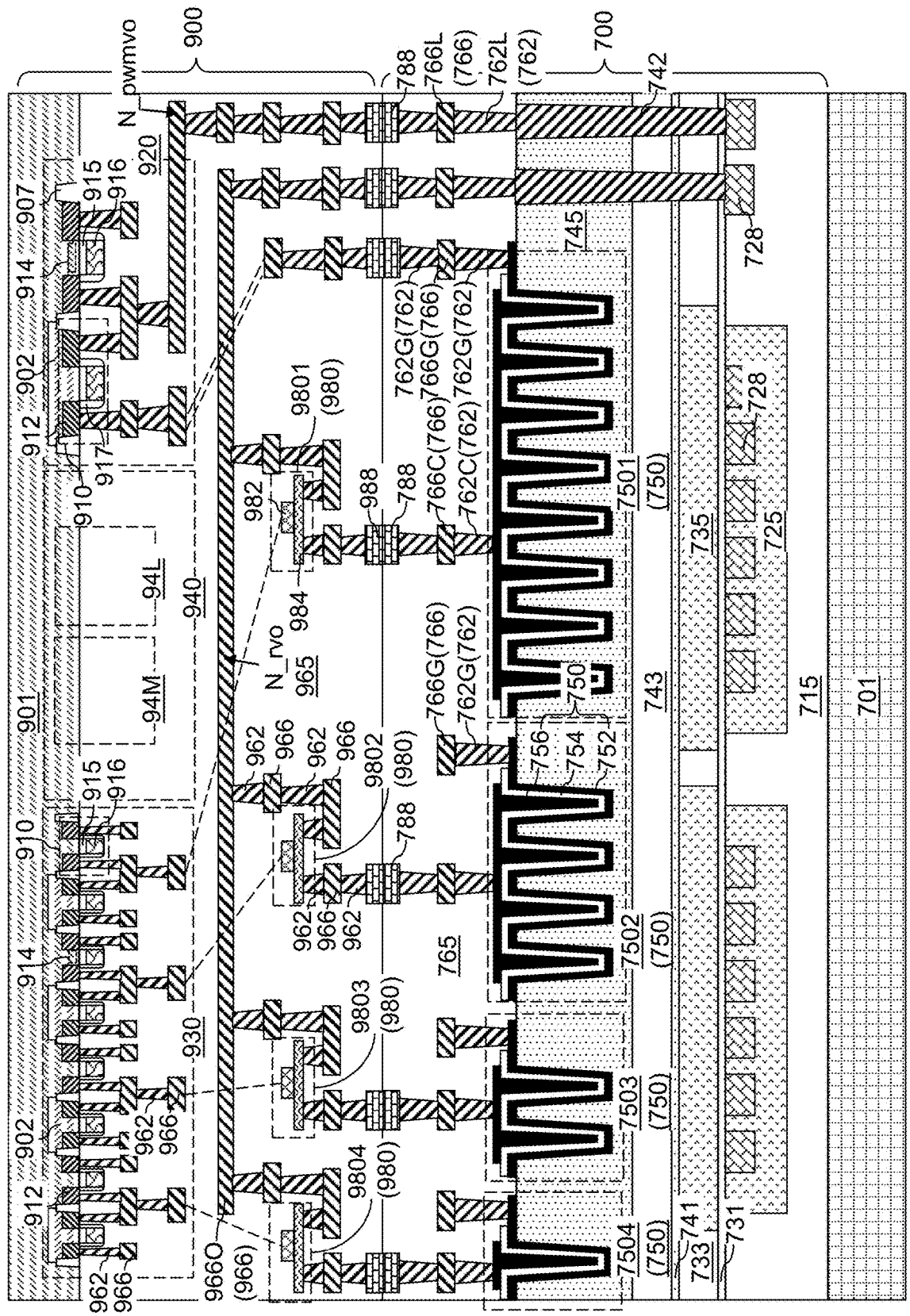
FIG. 9 is a vertical cross-sectional view of a first bonded assembly after bonding the second semiconductor die to the first semiconductor die according to the first embodiment of the present disclosure.

Referring to FIG. 9, the second semiconductor die 700 may be bonded to the first semiconductor die 900. In one embodiment, a two-dimensional array of second semiconductor dies 700 located on the carrier wafer 701 may be bonded to a two-dimensional array of first semiconductor dies 900 sharing the first semiconductor substrate 901 using a wafer-to-wafer bonding process. In one embodiment, the bonding between the second semiconductor die 700 and the first semiconductor die 900 may be effected by metal-to-metal bonding (such as copper-to-copper bonding) between mating pairs of the first bonding pads 988 and the second bonding pads 788. Optionally, the topmost layer selected from the first dielectric material layers 965 and the topmost layer selected from the second dielectric material layers 765 may be bonded to each other by dielectric-to-dielectric bonding (such as oxide-to-oxide bonding).

The capacitors 750, the second metal interconnect structures (762, 766), the second bonding pads 788, the first bonding pads 988, the first metal interconnect structures (962, 966), and the PCM switches 980 may be arranged such that series connections of a respective one of the capacitors 750 and a respective one of the PCM switches 980 are formed between the regulated voltage output node N_rvo (comprising the output bus metal line structure 9660 in the first semiconductor die 900) and electrical ground (comprising a subset of the first metal interconnect structures (962, 966), the first bonding pads 988, the second bonding pads 788, and the second metal interconnect structures (762, 766)). For example, a combination of a first PCM switch 9801 and a first capacitor 7501 forms a first series connection; a combination of a second PCM switch 9802 and a second capacitor 7502 forms a second series connection; a combination of a third PCM switch 9803 and a third capacitor 7503 forms a third series connection; and a combination of a fourth PCM switch 9804 and a fourth capacitor 7504 forms a fourth series connection.

Each series connection of a respective capacitor 750 and a respective PCM switch 980 constitutes a capacitor-switch assembly (750, 980). Each capacitor-switch assembly (750, 980) has a first end node that may be connected to the regulated voltage output node N_rvo (comprising the output bus metal line structure 9660 in the first semiconductor die 900), and has a second end node that may be connected to electrical ground. Thus, the capacitor-switch assemblies (750, 980) are interconnected to one another in a parallel connection to provide a parallel connection structure containing a plurality of capacitor-switch assemblies (750, 980).

According to an aspect of the present disclosure, each capacitor 750 within the capacitor-switch assemblies (750, 980) is located within the second semiconductor die 700, and each PCM switch within the capacitor-switch assemblies (750, 980) is located within the first semiconductor die 900.

Generally, the bonded assembly (900, 700) comprises a first semiconductor die 900 that comprises a pulse width modulation (PWM) circuit 920 including a first set of field effect transistors 910 located on a first semiconductor substrate 901 and connected to a PWM voltage output node N_pwmvo at which a pulsed voltage output is generated. The bonded assembly (900, 700) comprises a second semiconductor die 700 that comprises capacitors 750 therein and is bonded to the first semiconductor die 900. Capacitor-switch assemblies (750, 980) are located within the bonded assembly (900, 700). Each of the capacitor-switch assemblies (750, 980) comprises a respective series connection of a respective one of the capacitors 750 and a respective switch 980. The voltage regulator circuit comprises a series connection SC of an inductor 728 and a parallel connection circuit, the parallel connection circuit including a parallel connection of the capacitor-switch assemblies (750, 980).

In one embodiment, bonding interfaces between the second bonding pads 788 and the first bonding pads 988 are located within a bonding plane (which may be a horizontal plane), and one of the second dielectric material layers 765 is bonded to one of the first dielectric material layers 965 by dielectric-to-dielectric bonding.

In one embodiment, the bonded assembly (900, 700) comprises a voltage regulator circuit that comprises the PWM circuit 920 and a series connection of an inductor 728 and a parallel connection circuit. The parallel connection circuit includes a parallel connection of the capacitor-switch assemblies (750, 980). A first end node of the series connection is connected to the PWM voltage output node N_pwmvo, and a second end node of the series connection is connected to electrical ground.

Figure 10:
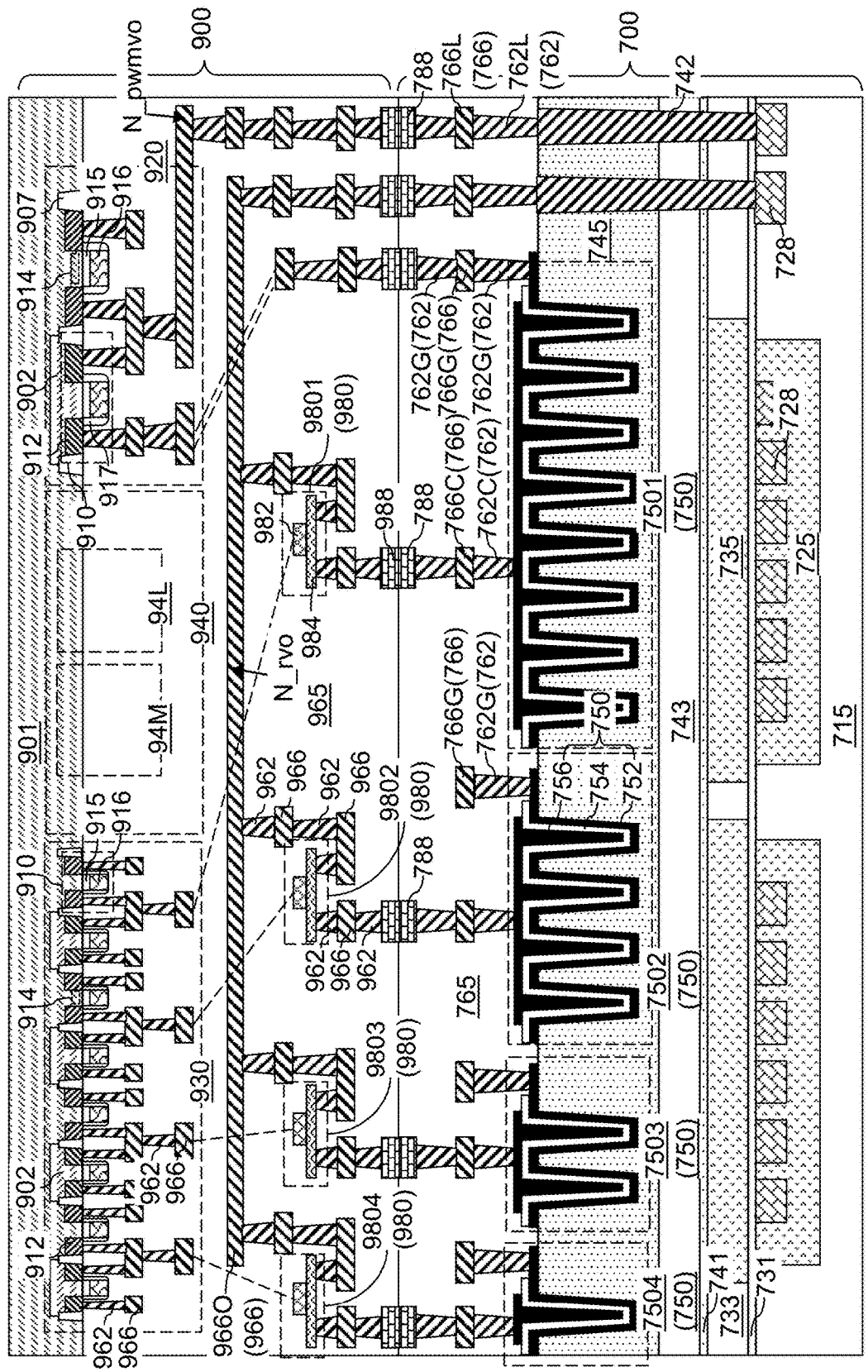
FIG. 10 is a vertical cross-sectional view of the first bonded assembly after removal of the carrier wafer according to the first embodiment of the present disclosure.

Referring to FIG. 10, the carrier wafer 701 may be detached from the bonded assembly including the first semiconductor die 900 and the second semiconductor die 700. The bonded assembly may comprise a two-dimensional array of first semiconductor dies 900 and a two-dimensional array of second semiconductor dies 700. In this embodiment, a suitable dicing process may be performed to dice the bonded assembly into a plurality of bonded pairs of a respective first semiconductor die 900 and a respective second semiconductor die 700.

Figure 11:
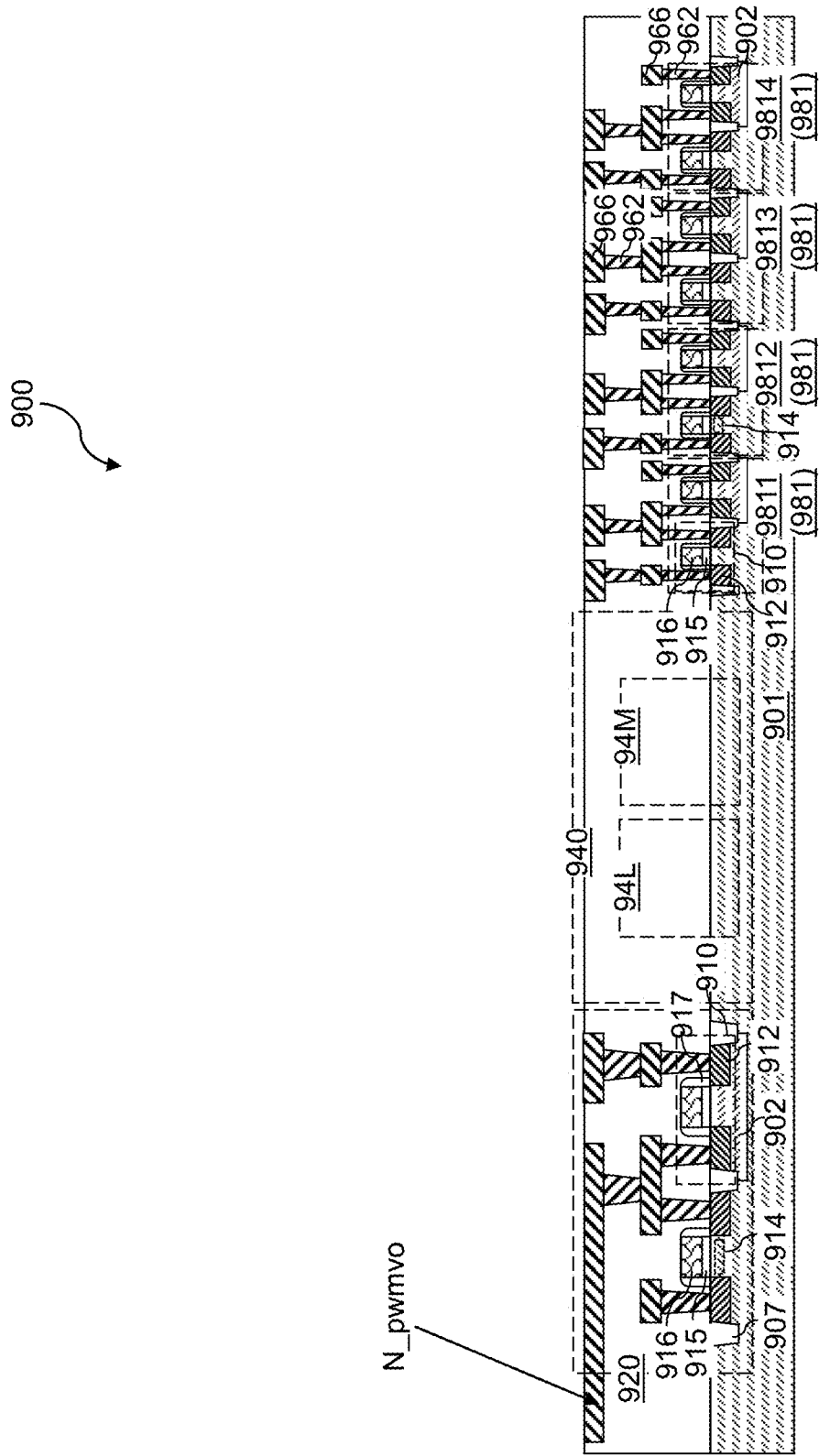
FIG. 11 is a vertical cross-sectional view of an alternative configuration of the first semiconductor die after formation of first semiconductor devices, first metal interconnect structures, and first dielectric material layers according to a second embodiment of the present disclosure.

Referring to FIG. 11, an alternative embodiment configuration of the first semiconductor die 900 may be derived from the first semiconductor die 900 illustrated in FIG. 1 by forming transistor switches 981 made of field effect transistors 910 in lieu of the programing pulse generator circuit 930 illustrated in FIG. 1. In this embodiment, the transistor switches 981 made of field effect transistors 910 may be used to electrically connect, or disconnect, a respective capacitor from a regulated voltage output node to be subsequently provided in the first semiconductor die 900.

As discussed above, the first semiconductor die 900 includes a pulse width modulation (PWM) circuit 920, which a first set of field effect transistors 910 located on a first semiconductor substrate 901 and connected to a PWM voltage output node N_pwmvo at which a pulsed voltage output is generated. In the alternative embodiment configuration of the first semiconductor die 900, the transistor switches 981 comprise a second set of field effect transistors 910 located on the first semiconductor substrate 901 and configured to provide electrical connection or electrical disconnection between a respective pair of first metal interconnect structures (962, 966) among the first metal interconnect structures (962, 966). In this embodiment, one of the electrical nodes to be connected or to be disconnected is electrically connected to a first source/drain region of a field effect transistor 910, and another of the electrical nodes to be connected or to be disconnected is electrically connected to a second source/drain region of the field effect transistor 910. For example, the transistor switches 981 may comprise a first transistor switch 9811, a second transistor switch 9812, a third transistor switch 9813, a fourth transistor switch 9814, etc.

Generally, a switch control circuit 940 may be located on the first semiconductor substrate 901, and may be configured to control turn-on and turn-off of each of the transistor switches 981 within the capacitor-switch assemblies (750, 981) by applying gate voltages to the field effect transistors 910 within the second set of field effect transistors 910. In one embodiment, the switch control circuit 940 is configured to receive a value for a target direct current (DC) output voltage for the voltage regulator circuit; the switch control circuit 940 comprises a memory array 94M containing a look-up table for values of the gate voltages for each value of the target DC output voltage; and the switch control circuit 940 is configured to generate the gate voltages for the field effect transistors 910 within the second set of field effect transistors 910 using the look-up table and the received value for the target DC output voltage.

Figure 12:
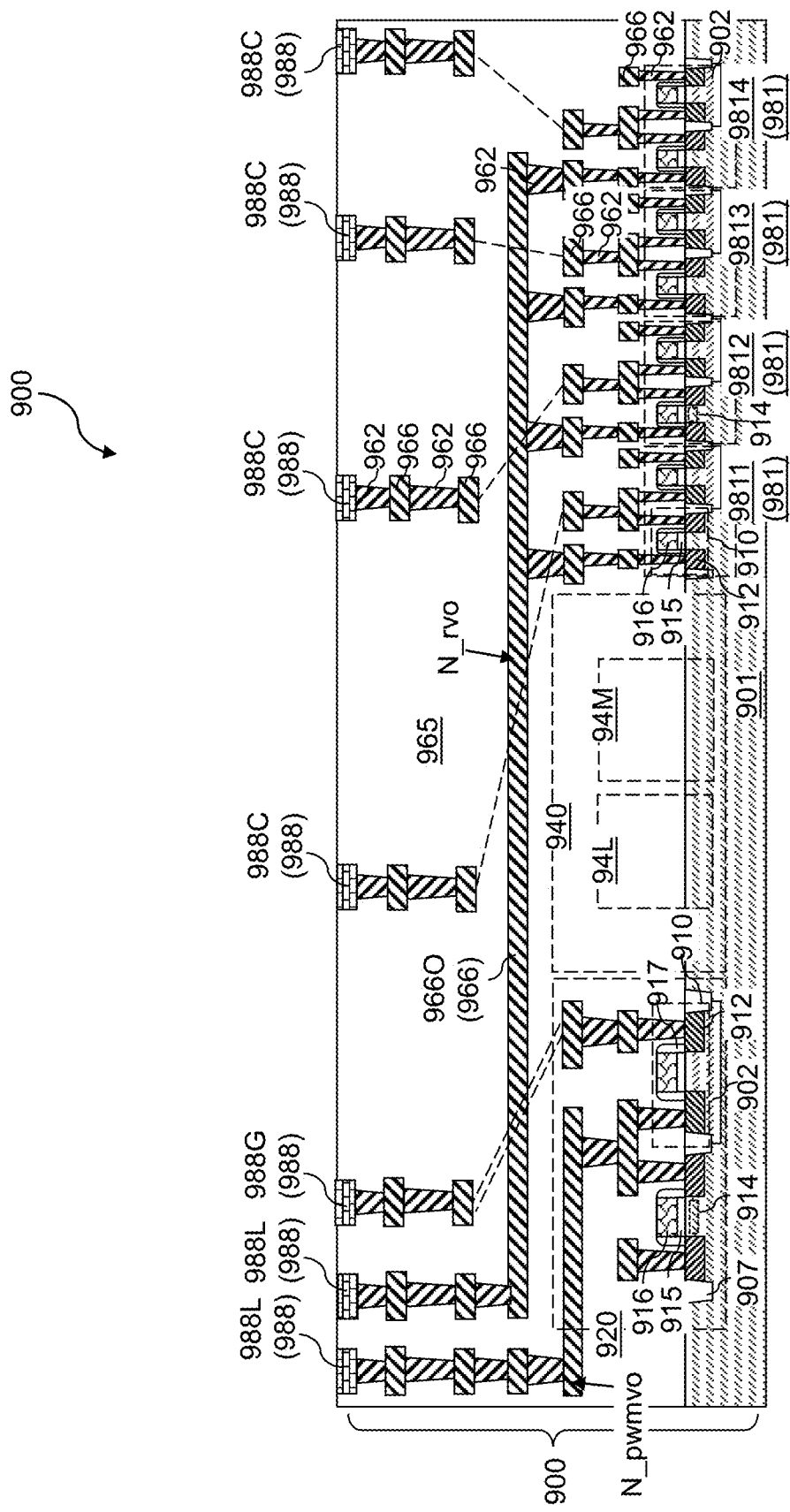
FIG. 12 is a vertical cross-sectional view of the alternative configuration of the first semiconductor die after formation additional first metal interconnect structures, first bonding pads, and additional first dielectric material layers according to the second embodiment of the present disclosure.

Referring to FIG. 12, additional first metal interconnect structures (962, 966), first bonding pads 988, and additional first dielectric material layers 965 may be formed. First bonding pads 988 may be formed in the topmost one of the first dielectric material layers 965, which is herein referred to as a first bonding-level dielectric layer (not separately shown). The first bonding pads 988 may comprise a pair of inductor-connection bonding pads 988L, at least one electrical-ground bonding pad 988G, and a plurality of capacitor-connection bonding pads 988C.

The electrically conductive paths provided by the first metal interconnect structures (962, 966) comprise connections for the power input node of the PWM circuit 920, which is connected to the power input from a printed circuit board (not shown) upon electrical connection of the first semiconductor die to the printed circuit board. An output node of the PWM circuit 920 comprises the PWM voltage output node N_pwmvo at which a pulsed voltage output is generated. Thus, the output node of the first set of field effect transistors 910 is connected to, and may be the same as, the PWM voltage output node N_pwmvo. Further, a subset of the first metal line structures 966 constitutes an output bus metal line structure 9660, which is the node of the regulated voltage output, i.e., the regulated voltage output node N_rvo.

A first electrical node of each transistor switch 981 may be electrically connected to the output bus metal line structure 9660 (which is the node of the regulated voltage output, i.e., the regulated voltage output node N_rvo), and a second electrical node of each transistor switch 981 may be electrically connected to a respective one of the capacitor-connection bonding pads 988C. Parts of the electrically conductive paths that are not expressly shown are schematically represented by dotted lines. One of the inductor-connection bonding pads 988L is electrically connected to a first metal interconnect structure (962, 966) embodying the PWM voltage output node N_pwmvo. Another of the inductor-connection bonding pads 988L is electrically connected to the output bus metal line structure 9660. The at least one electrical-ground bonding pad 988G may be electrically connected to other electrical ground nodes (of which one connection is schematically illustrated by a double-dotted line).

Generally, a first semiconductor die 900 is provided, which comprises a first semiconductor substrate 901, a pulse width modulation (PWM) circuit 920 including a first set of field effect transistors 910 located on the first semiconductor substrate 901, and first metal interconnect structures (962, 966) and first bonding pads 988 located in first dielectric material layers 965. The PWM circuit 920 comprises a PWM voltage output node N_pwmvo at which a pulsed voltage output is generated. Transistor switches 981 may be formed on the first semiconductor substrate 901.

Figure 13:
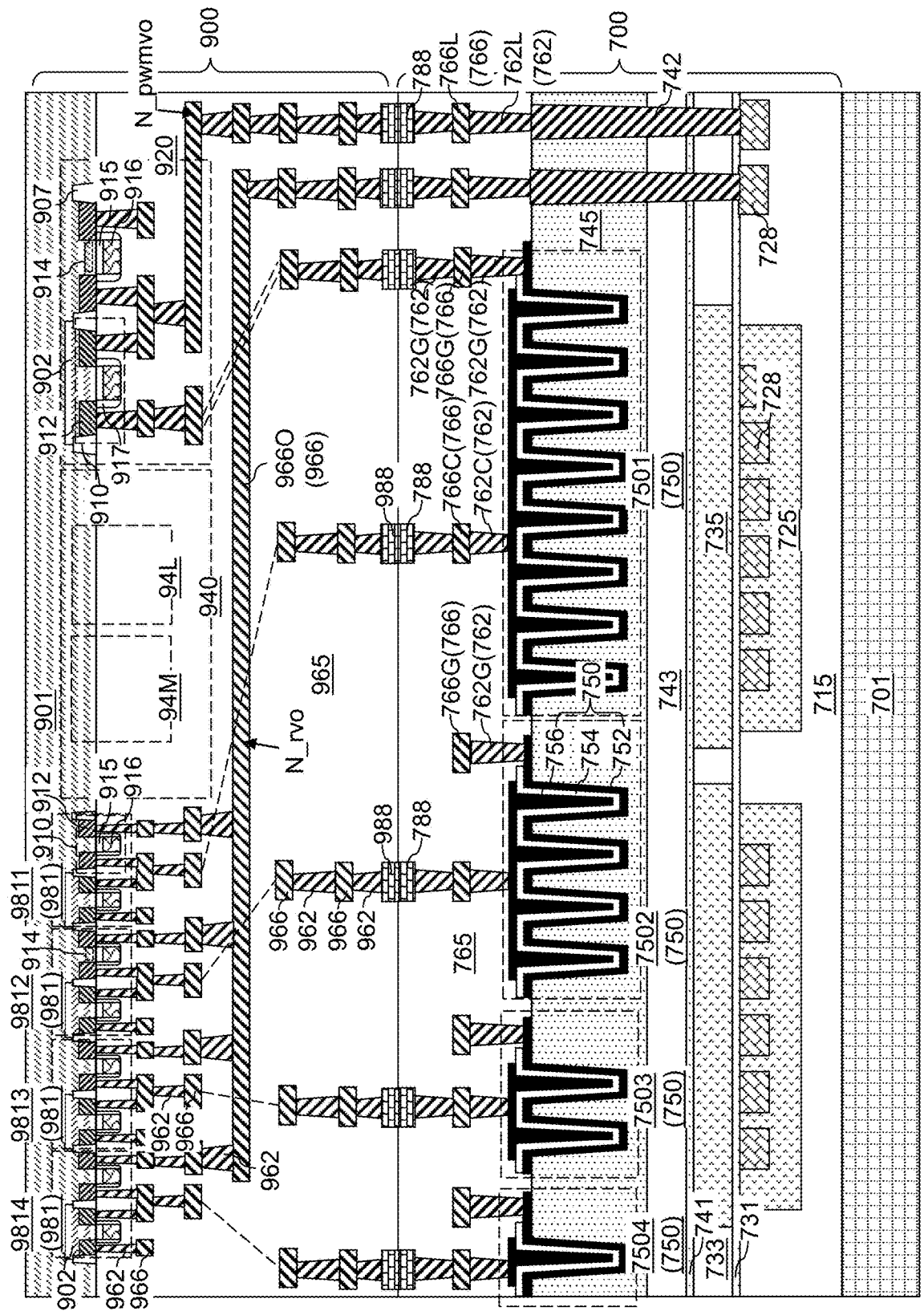
FIG. 13 is a vertical cross-sectional view of a second bonded assembly after bonding the second semiconductor die to the alternative configuration of the first semiconductor die according to the second embodiment of the present disclosure.

Referring to FIG. 13, the second semiconductor die 700 may be bonded to the alternative embodiment configuration of the first semiconductor die 900. The processing steps described with reference to FIG. 9 may be used to effect affect the bonding process.

The capacitors 750, the second metal interconnect structures (762, 766), the second bonding pads 788, the first bonding pads 988, the first metal interconnect structures (962, 966), and the transistor switches 981 may be arranged such that series connections of a respective one of the capacitors 750 and a respective one of the transistor switches 981 are formed between the regulated voltage output node N_rvo (comprising the output bus metal line structure 9660 in the first semiconductor die 900) and electrical ground (comprising a subset of the first metal interconnect structures (962, 966), the first bonding pads 988, the second bonding pads 788, and the second metal interconnect structures (762, 766)). For example, a combination of a first transistor switch 9811 and a first capacitor 7501 forms a first series connection; a combination of a second transistor switch 9812 and a second capacitor 7502 forms a second series connection; a combination of a third transistor switch 9813 and a third capacitor 7503 forms a third series connection; and a combination of a fourth transistor switch 9814 and a fourth capacitor 7504 forms a fourth series connection.

Each series connection of a respective capacitor 750 and a respective transistor switch 981 constitutes a capacitor-switch assembly (750, 981). Each capacitor-switch assembly (750, 981) has a first end node that is connected to the regulated voltage output node N_rvo (comprising the output bus metal line structure 9660 in the first semiconductor die 900), and has a second end node that is connected to electrical ground. Thus, the capacitor-switch assemblies (750, 981) are interconnected to one another in a parallel connection to provide a parallel connection structure containing a plurality of capacitor-switch assemblies (750, 981).

According to an aspect of the present disclosure, each capacitor 750 within the capacitor-switch assemblies (750, 981) is located within the second semiconductor die 700, and each transistor switch within the capacitor-switch assemblies (750, 981) is located within the first semiconductor die 900.

Generally, the bonded assembly (900, 700) comprises a first semiconductor die 900 that comprises a pulse width modulation (PWM) circuit 920 including a first set of field effect transistors 910 located on a first semiconductor substrate 901 and connected to a PWM voltage output node N_pwmvo at which a pulsed voltage output is generated. The bonded assembly (900, 700) comprises a second semiconductor die 700 that comprises capacitors 750 therein and is bonded to the first semiconductor die 900. Capacitor-switch assemblies (750, 981) are located within the bonded assembly (900, 700). Each of the capacitor-switch assemblies (750, 981) comprises a respective series connection of a respective one of the capacitors 750 and a respective switch 981. The voltage regulator circuit comprises a series connection SC of an inductor 728 and a parallel connection circuit, the parallel connection circuit including a parallel connection of the capacitor-switch assemblies (750, 981).

In one embodiment, bonding interfaces between the second bonding pads 788 and the first bonding pads 988 are located within a bonding plane (which may be a horizontal plane), and one of the second dielectric material layers 765 is bonded to one of the first dielectric material layers 965 by dielectric-to-dielectric bonding.

In one embodiment, the bonded assembly (900, 700) comprises a voltage regulator circuit that comprises the PWM circuit 920 and a series connection of an inductor 728 and a parallel connection circuit. The parallel connection circuit includes a parallel connection of the capacitor-switch assemblies (750, 981). A first end node of the series connection is connected to the PWM voltage output node N_pwmvo, and a second end node of the series connection is connected to electrical ground.

Figure 14:
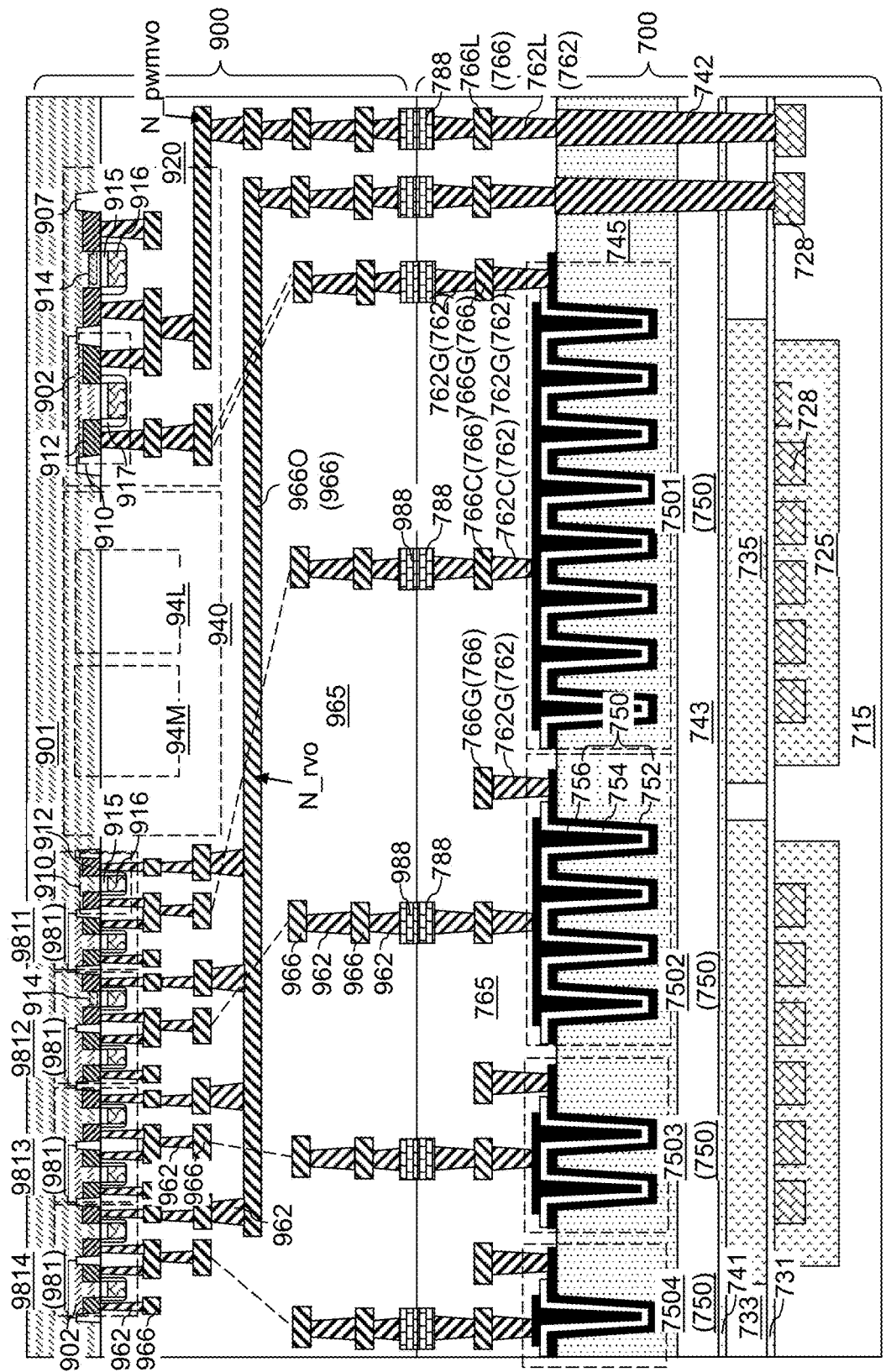
FIG. 14 is a vertical cross-sectional view of the second bonded assembly after removal of the carrier wafer according to the second embodiment of the present disclosure.

Referring to FIG. 14, the carrier wafer 701 may be detached from the bonded assembly including the first semiconductor die 900 and the second semiconductor die 700. The bonded assembly may comprise a two-dimensional array of first semiconductor dies 900 and a two-dimensional array of second semiconductor dies 700. In this embodiment, a suitable dicing process may be performed to dice the bonded assembly into a plurality of bonded pairs of a respective first semiconductor die 900 and a respective second semiconductor die 700.

Figure 15A:
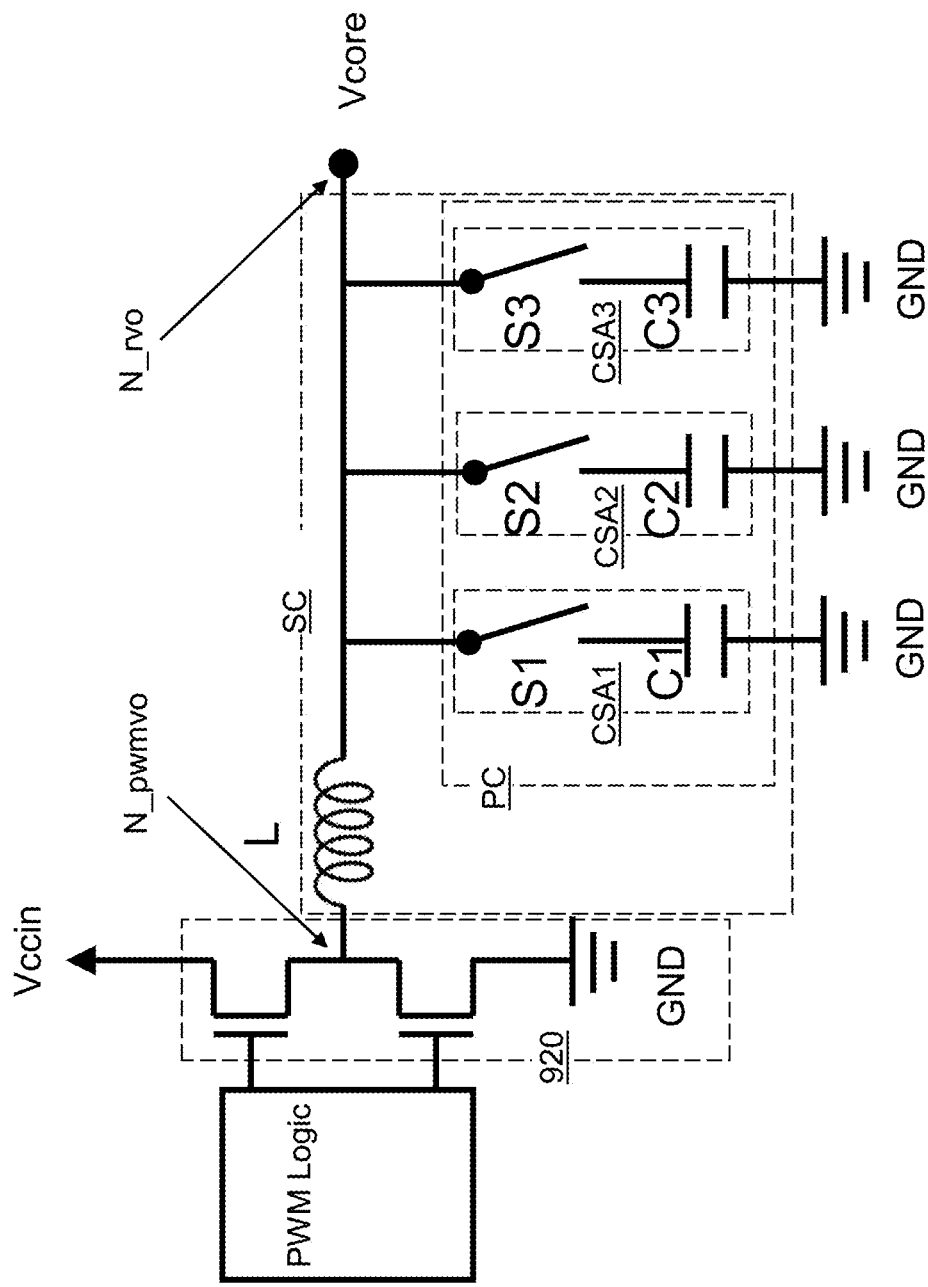
FIG. 15A is a general circuit diagram of a voltage regulator circuit of the present disclosure.
Figure 15B:
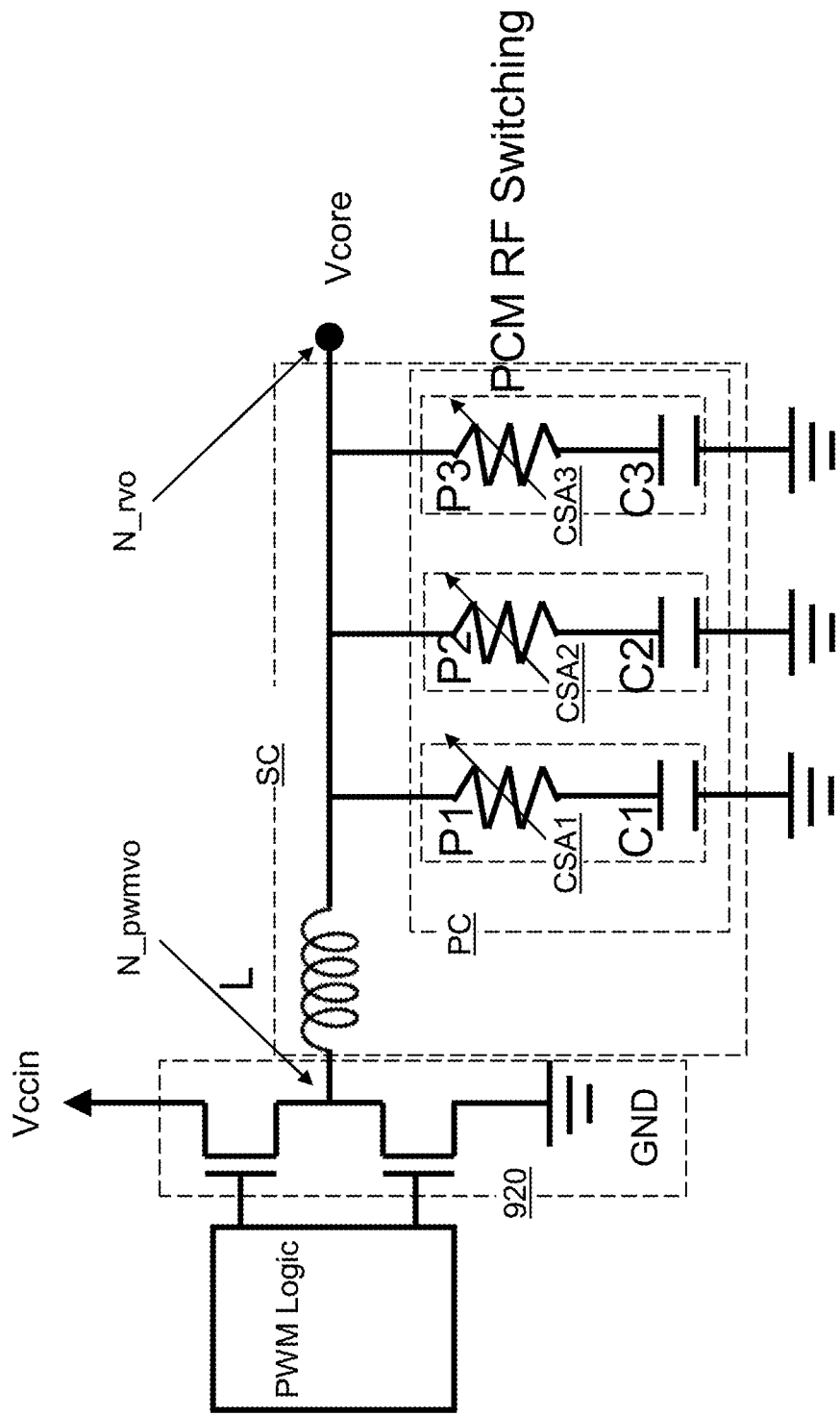
FIG. 15B is a circuit diagram of the voltage regulator circuit of the present disclosure in embodiments in which the switches may comprise PCM switches according to the first embodiment of the present disclosure.
Figure 15C:
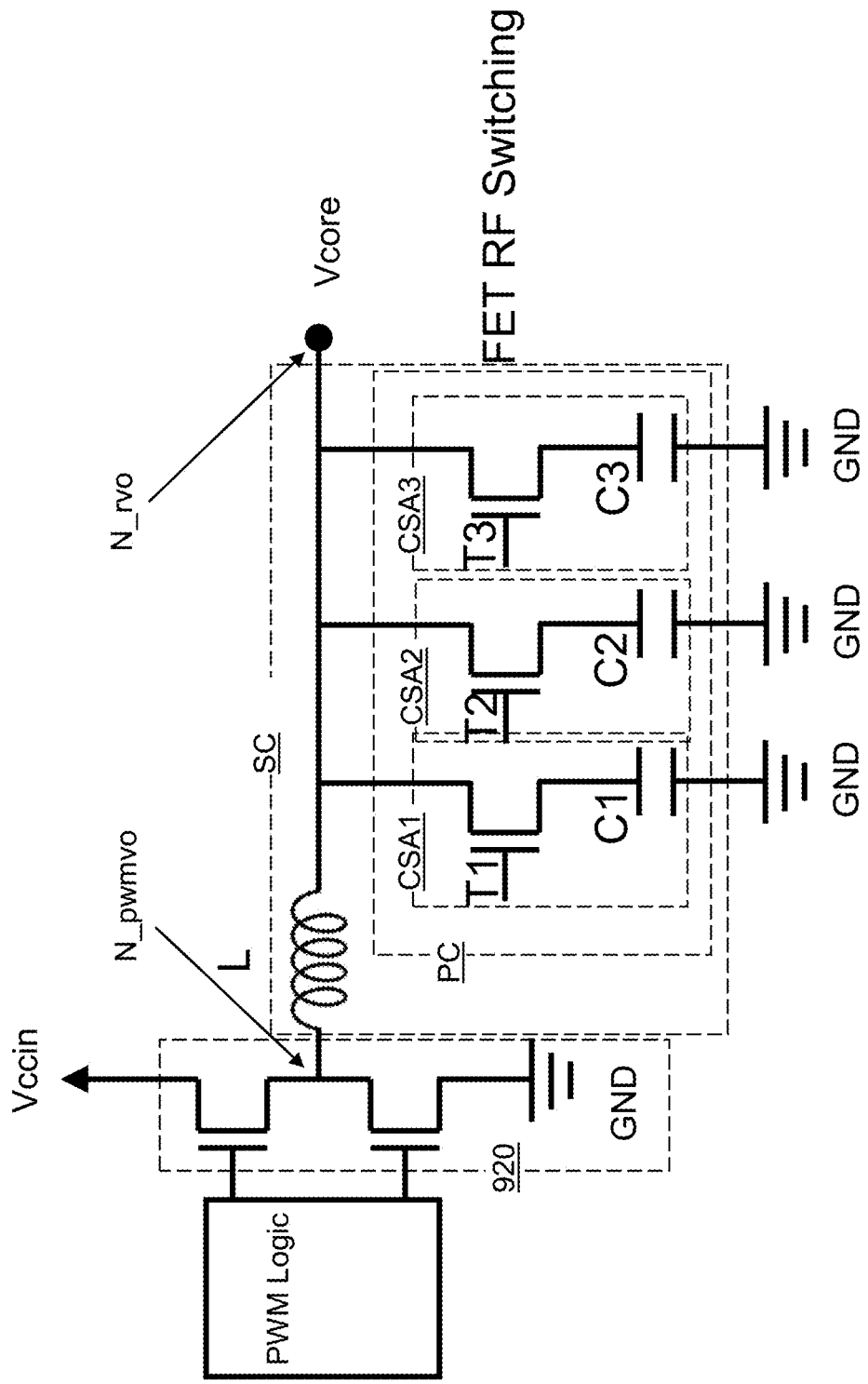
FIG. 15C is a circuit diagram of the voltage regulator circuit of the present disclosure in embodiments in which the switches may comprise field effect transistors according to the second embodiment of the present disclosure.

FIG. 15A is a general circuit diagram of a voltage regulator circuit of the present disclosure. FIG. 15B is a circuit diagram of the voltage regulator circuit of the present disclosure in embodiments in which the switches may comprise PCM switches 980 (represented as P1, P2, P3) according to the first embodiment of the present disclosure. FIG. 15C is a circuit diagram of the voltage regulator circuit of the present disclosure in embodiments in which the switches may comprise field effect transistors 910 (represented as T1, T2, T3) according to the second embodiment of the present disclosure. The capacitors 750 are represented as C1, C2, C3, and the inductor 728 is represented as L. While the circuit diagrams of FIGS. 15A-15C illustrate three capacitor-switch assemblies (CSA1, CSA2, CSA3), it is understood that the total number of capacitor-switch assemblies (CSA1, CSA2, CSA3) may be any number greater than 1, such as from 2 to 1,000,000, and/or from 3 to 1,000, and/or from 4 to 256. Further, the capacitance of each capacitor (C1, C2, C3, etc.) may be a unit capacitance and a respective non-negative power of 2.

Generally, the bonded assembly (900, 700) illustrated in FIG. 10 or 14 comprises a voltage regulator circuit that comprises a PWM circuit 920 and a series connection SC of an inductor 728 and a parallel connection circuit PC, the parallel connection circuit including a parallel connection of the capacitor-switch assemblies (750, 980). Each switch within the capacitor-switch assemblies (750, 980) may be located within the first semiconductor die 900.

Generally, each of the capacitor-switch assemblies (750, 980) comprises a respective series connection of a respective capacitor 750 and a respective switch 980; each switch (980, 981) within the capacitor-switch assemblies (750, 980) is located within the first semiconductor die 900; the capacitors 750 may be located in the second semiconductor die 700; and the inductor 728 may be located in the second semiconductor die 700. A first end node of the series connection SC is connected to the PWM voltage output node N_pwmvo; and a second end node of the series connection SC is connected to electrical ground.

Figure 16:
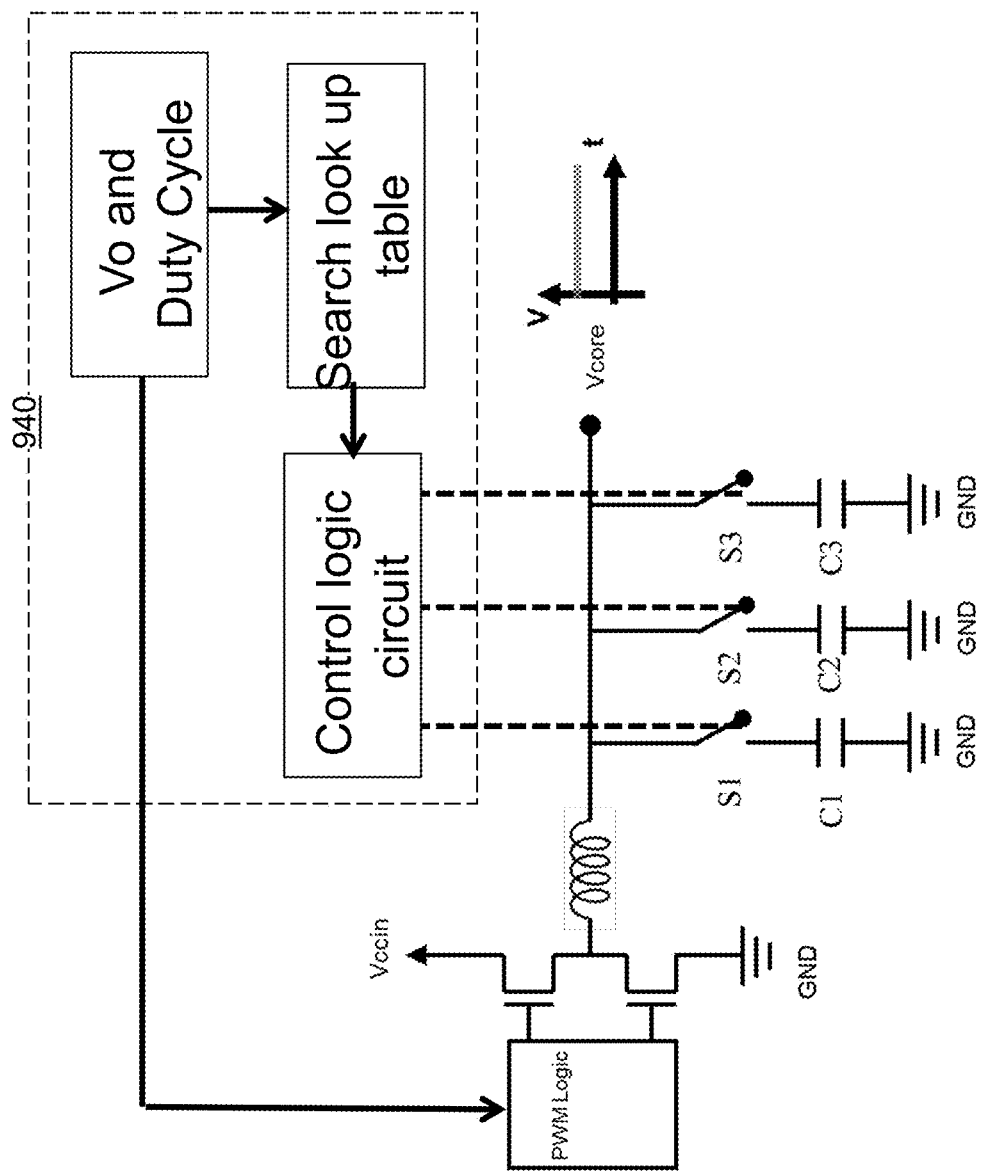
FIG. 16 is a diagram illustrating components of a voltage regulator circuit of the present disclosure.

Referring to FIG. 16, a diagram illustrates components of an embodiment voltage regulator circuit of the present disclosure. The switch control circuit 940 may comprise various semiconductor components that may provide the functionality of determining the target voltage output Vo and the required duty cycle D for the PWM circuit 920, a look up table and a cache register for retrieving a set of control instructions that corresponds to the target voltage output Vo, and a control logic circuit that generates the set of control voltages to be transmitted to the second subset of the field effect transistors 910 (which may be provided within a programing pulse generator circuit 930 or within the transistor switches 980).

Figure 17:
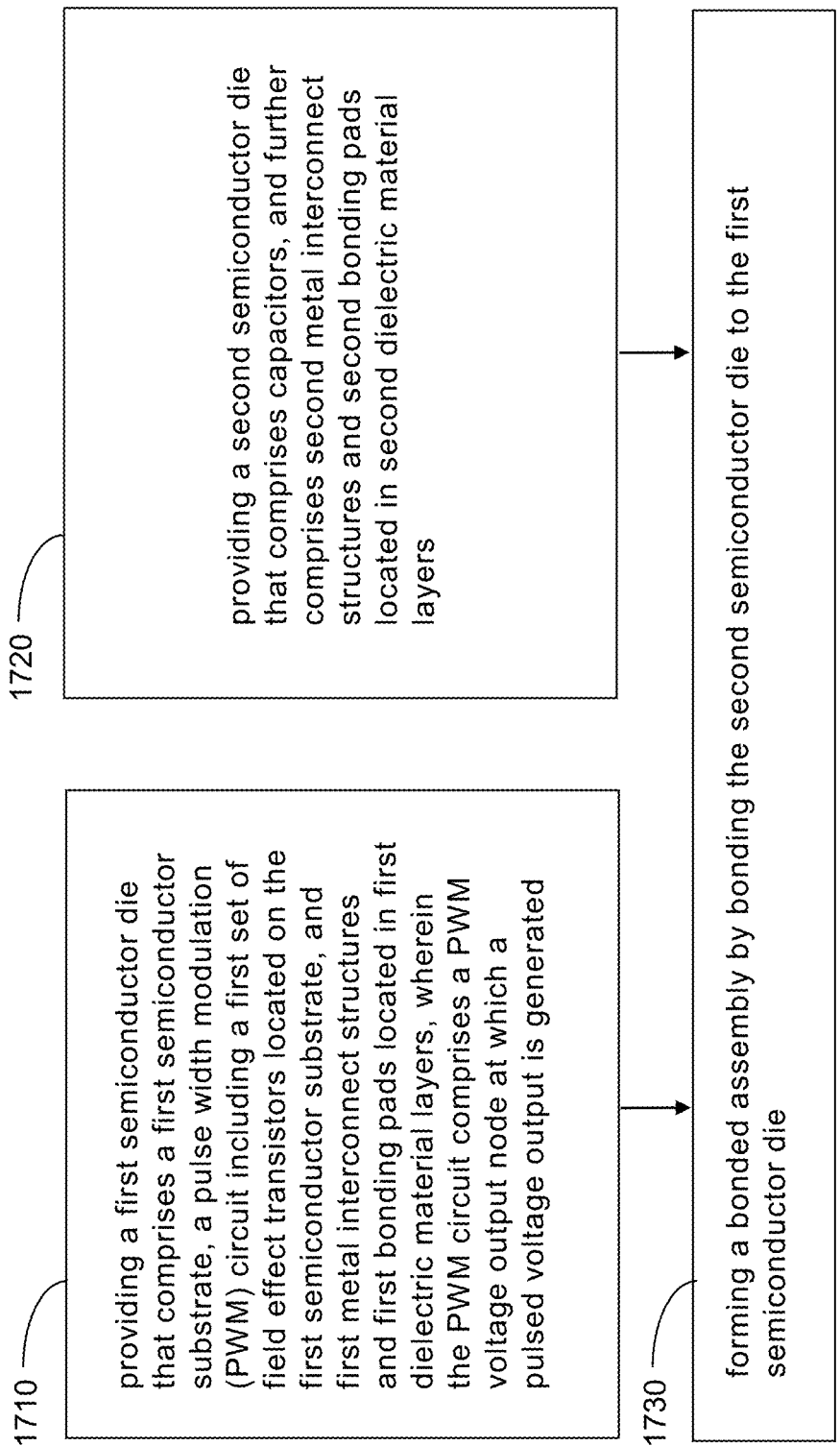
FIG. 17 is a flowchart that illustrates general processing steps for manufacturing a device structure according to an embodiment of the present disclosure.

Referring to FIG. 17, a flowchart illustrates general processing steps for manufacturing a device structure according to an embodiment of the present disclosure.

Referring to step 1710 and FIGS. 1-4 and 11-14, a first semiconductor die 900 is provided, which comprises a first semiconductor substrate 901, a pulse width modulation (PWM) circuit 920 including a first set of field effect transistors 910 located on the first semiconductor substrate 901, and first metal interconnect structures (962, 966) and first bonding pads 988 located in first dielectric material layers 965, wherein the PWM circuit comprises a PWM voltage output node N_pwmvo at which a pulsed voltage output is generated.

Referring to step 1720 and FIGS. 5-8, a second semiconductor die 700 is provided, which comprises capacitors 750, and further comprises second metal interconnect structures (762, 766) and second bonding pads 788 located in second dielectric material layers 765.

Referring to step 1730 and FIGS. 9, 10, and 15-16, a bonded assembly is formed by bonding the second semiconductor die 700 to the first semiconductor die 900. The bonded assembly comprises capacitor-switch assemblies (CAS1, CSA2, CSA3), each of the capacitor-switch assemblies (CAS1, CSA2, CSA3) comprising a respective series connection of a respective one of the capacitors 750 and a respective switch (980, 981). The bonded assembly comprises a voltage regulator circuit that comprises the PWM circuit and a series connection SC of an inductor 728 and a parallel connection circuit, the parallel connection circuit including a parallel connection PC of the capacitor-switch assemblies (CAS1, CSA2, CSA3).

Referring to all drawings and according to various embodiments of the present disclosure, a device structure comprising a voltage regulator circuit is provided. The voltage regulator circuit comprises: a first semiconductor die 900 including a pulse width modulation (PWM) circuit 920 comprising a first set of field effect transistors 910 located on a first semiconductor substrate 901 and connected to a PWM voltage output node N_pwmvo at which a pulsed voltage output is generated; and a series connection SC of an inductor 728 and a parallel connection circuit, the parallel connection circuit including a parallel connection PC of capacitor-switch assemblies {750, (980, 981)}, wherein: a first end node of the series connection is connected to the PWM voltage output node N_pwmvo; a second end node of the series connection is connected to electrical ground; each of the capacitor-switch assemblies {750, (980, 981)} comprises a respective series connection of a respective capacitor 750 and a respective switch (980, 981); and each switch within the capacitor-switch assemblies {750, (980, 981)} is located within the first semiconductor die 900.

In one embodiment, device structure comprises a second semiconductor die 700 that is bonded to the first semiconductor die 900, wherein each capacitor 750 within the capacitor-switch assemblies {750, (980, 981)} is located within the second semiconductor die 700.

In one embodiment, the first semiconductor die 900 comprises first dielectric material layers 965 in which first metal interconnect structures (962, 966) and first bonding pads 988 are located; the second semiconductor die 700 comprises second dielectric material layers 765 in which second metal interconnect structures (762, 766) and second bonding pads 788 are located; and the second bonding pads 788 are bonded to a respective one of the first bonding pads 988 by metal-to-metal bonding.

In one embodiment, bonding interfaces between the second bonding pads 788 and the first bonding pads 988 are located within a bonding plane; and one of the second dielectric material layers 765 is bonded to one of the first dielectric material layers 965 by dielectric-to-dielectric bonding.

In one embodiment, the first semiconductor die 900 comprises first dielectric material layers 965 in which first metal interconnect structures (962, 966) and first bonding pads 988 are located; and the switches 980 within the capacitor-switch assemblies (750, 980) comprise phase change memory (PCM) switches 980 including a respective phase change memory (PCM) material portion 984P and a heater element 982 configurated to heat the PCM material portion 984P. In one embodiment, the first semiconductor die 900 comprises PCM programming transistors configured to control flow of electrical current through a respective one of the heating elements in the PCM switches 980.

In one embodiment, the switches 981 within the capacitor-switch assemblies (750, 981) comprise a second set of field effect transistors 910 located on the first semiconductor substrate 901 and configured to provide electrical connection or electrical disconnection between a respective pair of first metal interconnect structures (962, 966) within the first semiconductor die 900. In one embodiment, a first source/drain region 912 of each field effect transistor 910 selected from the second set of field effect transistors 910 is electrically connected to an electrical node of the inductor 728; and a second source/drain region 912 of each field effect transistor 910 selected from the second set of field effect transistors 910 is electrically connected to an electrical node of a respective capacitor 750 within the capacitor-switch assemblies (750, 981).

In one embodiment, the device structure comprises: a second set of field effect transistors 910 located on the first semiconductor substrate 901; and a switch control circuit 940 located on the first semiconductor substrate 901 and configured to control turn-on and turn-off of each of the switches (980, 981) within the capacitor-switch assemblies {750, (980, 981)} by applying gate voltages to the field effect transistors 910 within the second set of field effect transistors 910.

In one embodiment, the switch control circuit 940 is configured to receive a value for a target direct current (DC) output voltage for the voltage regulator circuit; the switch control circuit 940 comprises a memory array 94M containing a look-up table for values of the gate voltages for each value of the target DC output voltage; and the switch control circuit 940 is configured to generate the gate voltages for the field effect transistors 910 within the second set of field effect transistors 910 using the look-up table and the received value for the target DC output voltage.

According to an aspect of the present disclosure, a bonded assembly (900, 700) comprising a voltage regulator circuit is provided. The bonded assembly (900, 700) comprises a first semiconductor die 900 that comprises a pulse width modulation (PWM) circuit 920 including a first set of field effect transistors 910 located on a first semiconductor substrate 901 and connected to a PWM voltage output node N_pwmvo at which a pulsed voltage output is generated. The bonded assembly (900, 700) comprises a second semiconductor die 700 that comprises capacitors 750 therein and is bonded to the first semiconductor die 900. Capacitor-switch assemblies {750, (980, 981)} are located within the bonded assembly (900, 700), each of the capacitor-switch assemblies {750, (980, 981)} comprising a respective series connection of a respective one of the capacitors 750 and a respective switch (980, 981). The voltage regulator circuit comprises a series connection SC of an inductor 728 and a parallel connection circuit, the parallel connection circuit including a parallel connection PC of the capacitor-switch assemblies {750, (980, 981)}.

In one embodiment, each switch within the capacitor-switch assemblies {750, (980, 981)} is located within the first semiconductor die 900.

In one embodiment, the first semiconductor die 900 comprises first dielectric material layers 965 in which first metal interconnect structures (962, 966) and first bonding pads 988 are located; and the switches 980 within the capacitor-switch assemblies (750, 980) comprise phase change memory (PCM) switches 980 including a respective phase change memory (PCM) material portion 984P and a heater element 982 configurated to heat the PCM material portion 984P.

In one embodiment, the switches 981 within the capacitor-switch assemblies (750, 981) comprise a second set of field effect transistors 910 located on the first semiconductor substrate 901 and configured to provide electrical connection or electrical disconnection between a respective pair of first metal interconnect structures (962, 966) within the first semiconductor die 900.

In one embodiment, a second set of field effect transistors 910 located on the first semiconductor substrate 901; a switch control circuit 940 located on the first semiconductor substrate 901 and configured to control turn-on and turn-off of each of the switches (980, 981) within the capacitor-switch assemblies {750, (980, 981)} by applying gate voltages to the field effect transistors 910 within the second set of field effect transistors 910; the switch control circuit 940 is configured to receive a value for a target direct current (DC) output voltage for the voltage regulator circuit; the switch control circuit 940 comprises a memory array 94M containing a look-up table for values of the gate voltages for each value of the target DC output voltage; and the switch control circuit 940 is configured to generate the gate voltages for the field effect transistors 910 within the second set of field effect transistors 910 using the look-up table and the received value for the target DC output voltage.

The various embodiments of the present disclosure may be used to provide a voltage regulator circuit having a programmable output capacitance, which may be advantageously used to maintain the voltage fluctuation in the regulated output voltage with a predetermined specification range while minimizing power consumption at each setting of the target output voltage. The target output voltage may be changed during operation by instructions from an operating program or by other hardware-induced instructions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising a voltage regulator circuit, wherein the voltage regulator circuit comprises:
a first semiconductor die including a pulse width modulation (PWM) circuit comprising a first set of field effect transistors located on a first semiconductor substrate and connected to a PWM voltage output node at which a pulsed voltage output is generated; and
a series connection of an inductor and a parallel connection circuit, the parallel connection circuit including a parallel connection of capacitor-switch assemblies,
wherein:
a first end node of the series connection is connected to the PWM voltage output node;
a second end node of the series connection is connected to electrical ground;
each of the capacitor-switch assemblies comprises a respective series connection of a respective capacitor and a respective switch; and
each switch within the capacitor-switch assemblies is located within the first semiconductor die.

2. The device structure of claim 1, further comprising a second semiconductor die that is bonded to the first semiconductor die, wherein each capacitor within the capacitor-switch assemblies is located within the second semiconductor die.

3. The device structure of claim 2, wherein:
the first semiconductor die comprises first dielectric material layers in which first metal interconnect structures and first bonding pads are located;
the second semiconductor die comprises second dielectric material layers in which second metal interconnect structures and second bonding pads are located; and
the second bonding pads are bonded to a respective one of the first bonding pads by metal-to-metal bonding.

4. The device structure of claim 3, wherein:
bonding interfaces between the second bonding pads and the first bonding pads are located within a bonding plane; and
one of the second dielectric material layers is bonded to one of the first dielectric material layers by dielectric-to-dielectric bonding.

5. The device structure of claim 1, wherein:
the first semiconductor die comprises first dielectric material layers in which first metal interconnect structures and first bonding pads are located; and
the switches within the capacitor-switch assemblies comprise phase change memory (PCM) switches including a respective phase change memory (PCM) material portion and a heater element configured to heat the PCM material portion.

6. The device structure of claim 5, wherein the first semiconductor die comprises PCM programming transistors configured to control flow of electrical current through a respective heating element in the PCM switches.

7. The device structure of claim 1, wherein the switches within the capacitor-switch assemblies comprise a second set of field effect transistors located on the first semiconductor substrate and configured to provide electrical connection or electrical disconnection between a respective pair of first metal interconnect structures within the first semiconductor die.

8. The device structure of claim 7, wherein:
a first source/drain region of each field effect transistor selected from the second set of field effect transistors is electrically connected to an electrical node of the inductor; and
a second source/drain region of each field effect transistor selected from the second set of field effect transistors is electrically connected to an electrical node of a respective capacitor within the capacitor-switch assemblies.

9. The device structure of claim 1, further comprising:
a second set of field effect transistors located on the first semiconductor substrate; and
a switch control circuit located on the first semiconductor substrate and configured to control turn-on and turn-off of each of the switches within the capacitor-switch assemblies by applying gate voltages to the field effect transistors within the second set of field effect transistors.

10. The device structure of claim 9, wherein:
the switch control circuit is configured to receive a value for a target direct current (DC) output voltage for the voltage regulator circuit;
the switch control circuit comprises a memory array containing a look-up table for values of the gate voltages for each value of the target DC output voltage; and
the switch control circuit is configured to generate the gate voltages for the field effect transistors within the second set of field effect transistors using the look-up table and the received value for the target DC output voltage.

11. A bonded assembly comprising:
a voltage regulator circuit;
a first semiconductor die that comprises a pulse width modulation (PWM) circuit including a first set of field effect transistors located on a first semiconductor substrate and connected to a PWM voltage output node at which a pulsed voltage output is generated;
a second semiconductor die that comprises capacitors therein and is bonded to the first semiconductor die; and
capacitor-switch assemblies, each of the capacitor-switch assemblies comprising a respective series connection of a respective one of the capacitors and a respective switch, wherein:
the voltage regulator circuit comprises a series connection of an inductor and a parallel connection circuit, the parallel connection circuit including a parallel connection of the capacitor-switch assemblies.

12. The bonded assembly of claim 11, wherein each switch within the capacitor-switch assemblies is located within the first semiconductor die.

13. The bonded assembly of claim 12, wherein:
the first semiconductor die comprises first dielectric material layers in which first metal interconnect structures and first bonding pads are located; and
the switches within the capacitor-switch assemblies comprise phase change memory (PCM) switches including a respective phase change memory (PCM) material portion and a heater element configured to heat the PCM material portion.

14. The bonded assembly of claim 12, wherein the switches within the capacitor-switch assemblies comprise a second set of field effect transistors located on the first semiconductor substrate and configured to provide electrical connection or electrical disconnection between a respective pair of first metal interconnect structures within the first semiconductor die.

15. The bonded assembly of claim 11, further comprising:
a second set of field effect transistors located on the first semiconductor substrate; and
a switch control circuit located on the first semiconductor substrate and configured to control turn-on and turn-off of each of the switches within the capacitor-switch assemblies by applying gate voltages to the field effect transistors within the second set of field effect transistors, wherein:
the switch control circuit is configured to receive a value for a target direct current (DC) output voltage for the voltage regulator circuit;
the switch control circuit comprises a memory array containing a look-up table for values of the gate voltages for each value of the target DC output voltage; and
the switch control circuit is configured to generate the gate voltages for the field effect transistors within the second set of field effect transistors using the look-up table and the received value for the target DC output voltage.

16. A method of forming a device structure, the method comprising:
providing a first semiconductor die that comprises a first semiconductor substrate, a pulse width modulation (PWM) circuit including a first set of field effect transistors located on the first semiconductor substrate, and first metal interconnect structures and first bonding pads located in first dielectric material layers, wherein the PWM circuit comprises a PWM voltage output node at which a pulsed voltage output is generated;
providing a second semiconductor die that comprises capacitors, and further comprises second metal interconnect structures and second bonding pads located in second dielectric material layers; and
forming a bonded assembly by bonding the second semiconductor die to the first semiconductor die, wherein:
the bonded assembly comprises capacitor-switch assemblies, each of the capacitor-switch assemblies comprising a respective series connection of a respective one of the capacitors and a respective switch; and
the bonded assembly comprises a voltage regulator circuit that comprises the PWM circuit and a series connection of an inductor and a parallel connection circuit, the parallel connection circuit including a parallel connection of the capacitor-switch assemblies.

17. The method of claim 16, wherein each switch within the capacitor-switch assemblies is located within the first semiconductor die.

18. The method of claim 16, wherein the switches within the capacitor-switch assemblies comprise phase change memory (PCM) switches including a respective phase change memory (PCM) material portion and a heater element configured to heat the PCM material portion and located within the first dielectric material layers.

19. The method of claim 16, wherein the switches within the capacitor-switch assemblies comprise a second set of field effect transistors located on the first semiconductor substrate and configured to provide electrical connection or electrical disconnection between a respective pair of first metal interconnect structures among the first metal interconnect structures.

20. The method of claim 16, wherein:
the second bonding pads are bonded to the first bonding pads via metal-to-metal bonding; and
one of the second dielectric material layers is bonded to one of the first dielectric material layers by dielectric-to-dielectric bonding.

* * * * *